US012757449B2

(12) United States Patent
Jo et al.

(10) Patent No.: US 12,757,449 B2
(45) Date of Patent: Oct. 6, 2026

(54) FIELD EFFECT TRANSISTOR, CAPACITOR, AND ELECTRONIC APPARATUS INCLUDING DOMAIN-CONTROLLED FERROELECTRIC MATERIAL

(71) Applicant: Samsung Electronics Co., Ltd., Suwon-si (KR)

(72) Inventors: Sanghyun Jo, Suwon-si (KR); Jinseong Heo, Suwon-si (KR); Kihong Kim, Suwon-si (KR); Hyunjae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 375 days.

(21) Appl. No.: 18/495,220

(22) Filed: Oct. 26, 2023

(65) Prior Publication Data

US 2024/0162346 A1 May 16, 2024

(30) Foreign Application Priority Data

Nov. 10, 2022 (KR) ........................ 10-2022-0149356

(51) Int. Cl.
*H10D 30/69* (2025.01)
*H10B 12/00* (2023.01)
(Continued)

(52) U.S. Cl.
CPC ........... *H10D 30/701* (2025.01); *H10B 12/31* (2023.02); *H10D 1/692* (2025.01); *H10D 30/0415* (2025.01); *H10D 64/689* (2025.01)

(58) Field of Classification Search
CPC .. H10D 30/701; H10D 30/0415; H10D 30/62; H10D 1/692; H10D 1/68;
(Continued)

(56) References Cited

U.S. PATENT DOCUMENTS

| | | | | |
|---|---|---|---|---|
| 6,087,687 A * | 7/2000 | Katoh | .................. | H10D 30/701 257/190 |
| 6,760,246 B1 * | 7/2004 | Kamp | ..................... | G11C 11/22 365/65 |

(Continued)

FOREIGN PATENT DOCUMENTS

| | | | |
|---|---|---|---|
| CN | 111291877 A * | 6/2020 | ............. G06N 3/065 |
| JP | 4593204 B2 | 12/2010 | |

(Continued)

OTHER PUBLICATIONS

Ajay K. Yadav et al., "Spatially resolved steady-state negative capacitance", Nature, vol. 565, pp. 468-483, Jan. 24, 2019.

(Continued)

*Primary Examiner* — Sitaramarao S Yechuri
(74) *Attorney, Agent, or Firm* — HARNESS, DICKEY & PIERCE, P.L.C.

(57) ABSTRACT

A field effect transistor includes a source region, a drain region, a channel between the source region and the drain region, a gate insulating layer configured to cover an upper surface of the channel, and a gate electrode configured to cover an upper surface of the gate insulating layer. The gate insulating layer includes a first region where a ferroelectric crystal structure is dominant and a second region where a non-ferroelectric structure is dominant. The gate electrode includes a first pattern region facing the first region of the gate insulating layer and a second pattern region facing the second region of the gate insulating layer.

20 Claims, 24 Drawing Sheets

(51) Int. Cl.

| | |
|---|---|
| ***H10D 1/68*** | (2025.01) |
| ***H10D 30/01*** | (2025.01) |
| ***H10D 64/68*** | (2025.01) |

(58) Field of Classification Search

CPC ...... H10D 1/682; H10D 1/684; H10D 64/689; H10D 64/033; H10D 64/681; H10B 12/31; H10B 51/30; H10B 53/30

See application file for complete search history.

(56) References Cited

U.S. PATENT DOCUMENTS

| | | | | |
|---|---|---|---|---|
| 7,078,288 | B2 | 7/2006 | Ashikaga | |
| 10,210,921 | B1 | 2/2019 | Hwang | |
| 2004/0057274 | A1* | 3/2004 | Dimmler .............. | H10D 30/701 257/E29.272 |
| 2004/0057319 | A1* | 3/2004 | Dimmler .............. | H10D 30/701 257/E29.272 |
| 2017/0178712 | A1* | 6/2017 | Van Houdt .......... | H10D 64/033 |
| 2017/0365719 | A1 | 12/2017 | Chen et al. | |
| 2018/0144871 | A1 | 5/2018 | Kang et al. | |
| 2019/0207035 | A1 | 7/2019 | Chen et al. | |
| 2020/0055134 | A1* | 2/2020 | Heo ......................... | B23K 3/08 |
| 2021/0359101 | A1 | 11/2021 | Heo et al. | |
| 2022/0059671 | A1 | 2/2022 | Lai et al. | |
| 2022/0149182 | A1 | 5/2022 | Lai et al. | |
| 2022/0189546 | A1* | 6/2022 | Gong .................... | G11C 11/223 |
| 2023/0197807 | A1* | 6/2023 | Van Houdt .......... | H10D 64/511 257/295 |

FOREIGN PATENT DOCUMENTS

| | | | |
|---|---|---|---|
| KR | 10-1303853 | B1 | 9/2013 |
| KR | 2018-0058042 | A | 5/2018 |
| KR | 10-2025007 | B1 | 9/2019 |
| KR | 10-2021-0138993 | A | 11/2021 |

OTHER PUBLICATIONS

Suraj S. Cheema, et al., "Ultrathin ferroic $HfO_2$-$ZrO_2$ superlattice gate stack for advanced transistors", Nature, vol. 604, pp. 65-90, Apr. 7, 2022.

Michael Hoffmann et al., "Unveiling the double-well energy landscape in a ferroelectric layer", Nature, vol. 565, pp. 464-475, Jan. 24, 2019.

Korean Office Action dated Apr. 20, 2026 for corresponding Korean Patent Application No. 10-2022-0149356 and English-language translation thereof.

* cited by examiner

FIELD EFFECT TRANSISTOR, CAPACITOR, AND ELECTRONIC APPARATUS INCLUDING DOMAIN-CONTROLLED FERROELECTRIC MATERIAL

CROSS-REFERENCE TO RELATED APPLICATION

This application is based on and claims priority under 35 U.S.C. § 119 to Korean Patent Application No. 10-2022-0149356, filed on Nov. 10, 2022, in the Korean Intellectual Property Office, the disclosure of which is incorporated by reference herein in its entirety.

BACKGROUND

1. Field

The present inventive concepts relate to field effect transistors, capacitors, and electronic apparatuses each including a domain-controlled ferroelectric material.

2. Description of the Related Art

As the degree of integration of electronic apparatuses, such as memories or logic circuits, increases, electronic elements in the electronic apparatuses are becoming smaller in size. Accordingly, there is an increasing demand for downsizing and reducing the power consumption of electronic elements, such as transistors or capacitors. However, because the capacitance of a capacitor is proportional to the area of the capacitor, the capacitance may decrease as the size of the capacitor is reduced. When a thickness of a dielectric is reduced so as to increase the capacitance, a leakage current may increase. Accordingly, dielectric materials having a high dielectric constant (high-k) have been used in electronic apparatuses.

SUMMARY

Some example embodiments provide a field effect transistor, a capacitor, and/or an electronic apparatus each including a domain-controlled ferroelectric material. Such a field effect transistor, a capacitor, and/or an electronic apparatus may be configured to more effectively control domain characteristics of the ferroelectric material to effectively exhibit negative capacitance characteristics, to thereby enable novel low power apparatuses having improved (e.g., reduced) power consumption.

Some example embodiments provide a field effect transistor, a capacitor, and/or an electronic apparatus with improved low power characteristics and leakage current characteristics.

Additional aspects will be set forth in part in the description which follows and, in part, will be apparent from the description, or may be learned by practice of the presented embodiments of the present inventive concepts.

A field effect transistor according to some example embodiments includes: a source region; a drain region; a channel between the source region and the drain region; a gate insulating layer configured to cover an upper surface of the channel; and a gate electrode configured to cover an upper surface of the gate insulating layer, wherein the gate insulating layer includes a first region where a ferroelectric crystal structure is dominant and a second region where a non-ferroelectric structure is dominant, and the gate electrode includes a first pattern region facing the first region of the gate insulating layer and a second pattern region facing the second region of the gate insulating layer.

The gate insulating layer may include a plurality of first regions that are spaced apart from each other and two-dimensionally arranged in a horizontal direction that is parallel to the upper surface of the channel or a lower surface of the gate electrode, and the second region of the gate insulating layer may be between the plurality of first regions on a same plane as the plurality of first regions.

The second region of the gate insulating layer may be between at least two adjacent first regions of the plurality of first regions, such that the at least two adjacent first regions are separated from each other by at least the second region.

For example, an area of each of the plurality of first regions in a horizontal plane that is parallel to the upper surface of the channel or the lower surface of the gate electrode may be greater than or equal to about 0.25 $nm^2$ and less than or equal to about 1 μm.

The gate insulating layer include a plurality of first regions having a stripe shape extending in a first direction and a plurality of second regions having a stripe shape extending in the first direction. The plurality of first regions and the plurality of second regions may be alternately arranged in a second direction that is perpendicular to the first direction within a plane of the gate insulating layer.

A width of each region of the plurality of first regions and the plurality of second regions in the second direction may be about 0.5 nm or more and about 1 μm or less.

The gate insulating layer may include at least one of hafnium oxide, lead zirconate titanate (PZT), or zinc oxide, and the hafnium oxide may be doped with at least one element selected from zirconium (Zr), silicon (Si), aluminum (Al), lanthanum (La), gadolinium (Gd), and yttrium (Y).

For example, in the first region, a proportion of the ferroelectric crystal structure may be about 65 at % or more and a proportion of the non-ferroelectric structure may be about 35 at % or less, and in the second region, a proportion of the ferroelectric crystal structure may be about 35 at % or less and a proportion of the non-ferroelectric structure may be about 65 at % or more.

For example, in the first region, a proportion of orthorhombic crystals may be about 65 at % or more and a proportion of a sum of monoclinic crystals, tetragonal crystals, and amorphous structures may be about 35 at % or less, and in the second region, a proportion of orthorhombic crystals may be about 35 at % or less and a proportion of a sum of monoclinic crystals, tetragonal crystals, and amorphous structures may be about 65 at % or more.

The first pattern region of the gate electrode may include a first conductive material, and the second pattern region of the gate electrode may include a second conductive material having a thermal expansion coefficient that is different from a thermal expansion coefficient of the first conductive material.

The first pattern region of the gate electrode may include a plurality of first conductive materials that may be spaced apart from each other and two-dimensionally arranged in a direction parallel to the upper surface of the gate insulating layer within a plane of the gate electrode, and the second conductive material may be between the plurality of first conductive materials on a same plane as the plurality of first conductive materials.

The first pattern region of the gate electrode may include a plurality of first conductive materials having a stripe shape extending in a first direction. The second pattern region of the gate electrode may include a plurality of second conductive materials having a stripe shape extending in the first direction. The plurality of first conductive materials and the plurality of second conductive materials may be alternately arranged in a second direction perpendicular to the first direction within a plane of the gate electrode.

The first conductive material and the first region may be in direct contact with each other in a vertical direction that is perpendicular to the upper surface of the channel or a lower surface of the gate electrode, and second conductive material and the second region may be in direct contact with each other in the vertical direction.

The field effect transistor may further include a non-ferroelectric layer between the channel and the gate insulating layer, wherein the non-ferroelectric layer may include at least one of a paraelectric material, an antiferroelectric material, or an amorphous material.

The field effect transistor may further include a non-ferroelectric layer between the gate insulating layer and the gate electrode, wherein the non-ferroelectric layer may include at least one of a paraelectric material, an antiferroelectric material, or an amorphous material.

The field effect transistor may further include a substrate, wherein the channel may have a rod shape protruding and extending from an upper surface of the substrate, wherein the gate insulating layer may cover and surround three sides of the channel, and wherein the gate electrode may cover and surround three sides of the gate insulating layer.

The gate insulating layer may include a plurality of first regions extending along a surface of the channel in a stripe shape surrounding the three sides of the channel and a plurality of second regions extending along the surface of the channel in a stripe shape surrounding the three sides of the channel. The plurality of first regions and the plurality of second regions may be alternately arranged.

A capacitor according to some example embodiments includes: a first electrode; a second electrode facing the first electrode; and a dielectric layer between the first electrode and the second electrode, wherein the dielectric layer includes a first region where a ferroelectric crystal structure is dominant and a second region where a non-ferroelectric structure is dominant, and the second electrode includes a first pattern region facing the first region of the dielectric layer and a second pattern region facing the second region of the dielectric layer.

The capacitor may further include a non-ferroelectric layer that is between the first electrode and the dielectric layer or between the second electrode and the dielectric layer.

An electronic apparatus according to some example embodiments includes: a field effect transistor; and a capacitor electrically connected to the field effect transistor, wherein the field effect transistor includes: a source region; a drain region; a channel between the source region and the drain region; a gate insulating layer configured to cover an upper surface of the channel; and a gate electrode configured to cover an upper surface of the gate insulating layer, the gate insulating layer includes a first region where a ferroelectric crystal structure is dominant and a second region where a non-ferroelectric structure is dominant, and the gate electrode includes a first pattern region facing the first region of the gate insulating layer and a second pattern region facing the second region of the gate insulating layer.

BRIEF DESCRIPTION OF THE DRAWINGS

The above and other aspects, features, and advantages of some example embodiments of the present inventive concepts will be more apparent from the following description taken in conjunction with the accompanying drawings, in which.

DETAILED DESCRIPTION

Figure 1:
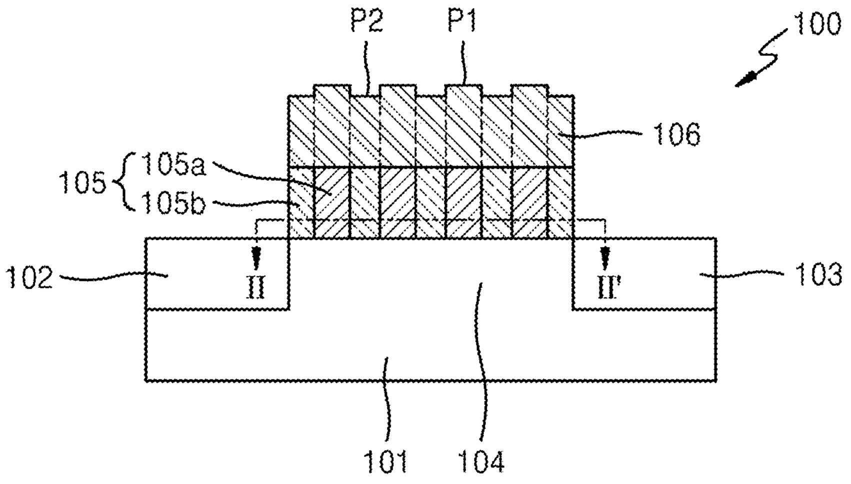
FIG. 1 is a cross-sectional view schematically illustrating a structure of a field effect transistor according to some example embodiments.

Reference will now be made in detail to some example embodiments, examples of which are illustrated in the accompanying drawings, wherein like reference numerals refer to like elements throughout. In this regard, some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a field effect transistor, a capacitor, and an electronic apparatus each including a domain-controlled ferroelectric material will be described in detail with reference to the accompanying drawings. In the following drawings, the same reference numerals denote the same elements, and the size of each element in the drawings may be exaggerated for clarity and convenience of explanation. In addition, embodiments described herein are merely examples, and various modifications may be made thereto from some example embodiments.

Hereinafter, the terms "above" or "on" may include not only those that are directly on in a contact manner, but also those that are above in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Operations constituting methods may be performed in any suitable order unless otherwise indicated herein or otherwise clearly contradicted by context, and are not necessarily limited to the stated order.

Also, the terms such as "unit" and "module" described in the specification mean units that process at least one function or operation, and may be implemented as hardware, software, or a combination of hardware and software.

Connecting lines or connecting members illustrated in the drawings are intended to represent example functional relationships and/or physical or logical connections between the various elements. It should be noted that many alternative or additional functional relationships, physical connections or logical connections may be present in a practical device.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a cross-sectional view schematically illustrating a structure of a field effect transistor 100 according to some example embodiments. Referring to FIG. 1, the field effect transistor 100 may include a source region 102, a drain region 103, a channel 104 between the source region 102 and the drain region 103, a gate insulating layer 105 disposed to cover the upper surface of the channel 104 (e.g., cover some or all of the upper surface of the channel 104), and a gate electrode 106 disposed to cover the upper surface of the gate insulating layer 105 (e.g., cover some or all of the upper surface of the gate insulating layer 105). In addition, the field effect transistor 100 may further include a substrate 101. The source region 102 and the drain region 103 may be respectively on both sides of the upper surface of the substrate 101. The channel 104 may be a partial region of the upper portion of the substrate 101. In some example embodiments, the source region 102 and the drain region 103 may be separate structures, layers, or the like on the substrate 101 and may include different materials. In some example embodiments, the source region 102 and the drain region 103 and the substrate 101 may be separate doped regions of a single piece of material, that are doped with one or more dopants to define the substrate 101 and the source region 102 and the drain region 103 and to further define the channel 104 between the source region 102 and the drain region 103.

Although not illustrated, the field effect transistor 100 may further include a source electrode and a drain electrode respectively on the source region 102 and the drain region 103. In addition, additional functional layers may be further between the source region 102 and the source electrode and between the drain region 103 and the drain electrode so as to reduce contact resistance between a semiconductor and a metal or reduce, minimize, or prevent diffusion of a metal.

The source region 102 and the drain region 103 may each be doped with a first conductivity type (e.g., doped with dopants having the first conductivity type), and the substrate 101 may be doped with a second conductivity type (e.g., doped with dopants having the second conductivity type) electrically opposite to the first conductivity type. For example, the substrate 101 may include a p-type semiconductor and the source region 102 and the drain region 103 may each include an n-type semiconductor. In some example embodiments, the substrate 101 may include an n-type semiconductor and the source region 102 and the drain region 103 may each include a p-type semiconductor. The substrate 101 may be doped with a relatively low concentration of about $10^{14}/cm^3$ to about $10^{18}/cm^3$, and the source region 102 and the drain region 103 may each be doped with a relatively high concentration of about $10^{19}/cm^3$ to $10^{21}/cm^3$ for low resistance. The source region 102 and the drain region 103 may be respectively formed by doping impurities into both sides (e.g., opposite sides) of the upper portion of the substrate 101. The upper portion of the substrate 101, in which the source region 102 and the drain region 103 are not formed, may be defined as the channel 104. Accordingly, the channel 104 may be between the source region 102 and the drain region 103.

The substrate 101, the source region 102, and the drain region 103 may include, for example, at least one semiconductor material selected from Group IV semiconductors, such as silicon (Si), germanium (Ge), or SiGe, Group III-V compound semiconductors, such as GaAs or GaP, Group II-VI compound semiconductors, oxide semiconductors, and/or two-dimensional material semiconductors. When the substrate 101, the source region 102, and the drain region 103 each include Si, Ge, SiGe, or the like, the substrate 101 may be doped with at least one dopant selected from boron (B), aluminum (Al), gallium (Ga), and indium (In), and the source region 102 and the drain region 103 may each be doped with at least one dopant selected from lead (Pb), arsenic (As), and stibium (Sb). In this case, the field effect transistor 100 is an n-channel metal-oxide semiconductor field effect transistor (NMOS). In contrast, the substrate 101 may be doped with at least one dopant selected from lead (Pb), arsenic (As), and stibium (Sb), and the source region 102 and the drain region 103 may each be doped with at least one dopant selected from B, Al, Ga, and In. In this case, the field effect transistor 100 is a p-channel metal-oxide semiconductor field effect transistor (PMOS).

The gate electrode 106 may have a conductivity of about 1 M ohm/square or less (e.g., about 0.01 ohm/square to about 1.00 M ohm/square). The gate electrode 106 may include at least one conductive material selected from a metal, metal nitride, metal carbide, polysilicon, and any combination thereof. For example, the metal may include aluminum (Al), tungsten (W), molybdenum (Mo), titanium (Ti), or tantalum (Ta), the metal nitride layer may include a titanium nitride (TiN) layer, or a tantalum nitride (TaN) layer, and the metal carbide may include an aluminum- or silicon-doped (containing) metal carbide. As a specific example, the metal carbide may include TiAlC, TaAlC, TiSiC, or TaSiC. The gate electrode 106 may have a structure in which a plurality of materials are stacked. For example, the gate electrode 106 may have a stacked metal nitride layer/metal layer structure, such as TiN/AI, or a stacked metal nitride layer/metal carbide layer/metal layer structure, such as TiN/TiAlC/W. The gate electrode 106 may include titanium nitride (TiN) or molybdenum (Mo) and may be variously modified. The gate electrode 106 may include a conductive two-dimensional material in addition to the materials described above. For example, the conductive two-dimensional material may include at least one of graphene, black phosphorus, amorphous boron nitride, two-dimensional hexagonal boron nitride (h-BN), or phosphorene.

The gate insulating layer 105 may include a ferroelectric material. For example, the gate insulating layer 105 may include a ferroelectric material having a fluorite structure, a perovskite structure, and/or a wurtzite structure. The ferroelectric material having the fluorite structure may include, for example, hafnium oxide ($HfO_2$). The hafnium oxide may be doped with at least one element selected from, for example, zirconium (Zr), silicon (Si), aluminum (Al), lanthanum (La), gadolinium (Gd), and yttrium (Y). In addition, the ferroelectric material having the perovskite structure may include, for example, lead zirconate titanate (PZT). The ferroelectric material having the wurtzite structure may include, for example, zinc oxide (ZnO).

The ferroelectric material may have a non-linear relationship between electric field and polarization. In particular, an inverse relationship may be formed between electric field and polarization in a section in which a polarization direction changes. A negative capacitance phenomenon may appear in this section. However, because pure ferroelectric materials have high free energy in this section and are thus unstable, it is difficult to observe an actual negative capacitance phenomenon.

According to some example embodiments, in order to implement optimal or improved negative capacitance characteristics, the gate insulating layer 105 may have a plurality of regions where ferroelectric materials and paraelectric or antiferroelectric materials are locally distributed. For example, the gate insulating layer 105 may include a plurality of first regions **105*a* and a plurality of second regions 105*b* between the first regions 105*a*. The first regions 105*a* and the second regions 105*b* may be arranged within a plane of the gate insulating layer 105. In other words, the first regions 105*a* and the second regions 105*b* may be arranged in a direction (e.g., horizontal direction), plane (e.g., horizontal plane), or the like parallel to the lower surface of the gate electrode 106 or the upper surface of the channel 104 contacting the gate insulating layer 105**.

Figure 2A:
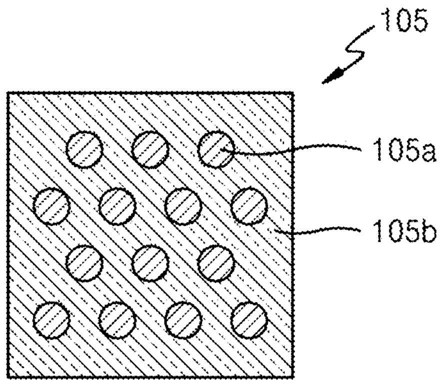
FIGS. 2A and 2B are respectively plan views illustrating distributions of regions within a gate insulating layer of the field effect transistor illustrated in FIG. 1 along the cross-sectional view line II-II' shown in FIG. 1 according to some example embodiments.
Figure 2B:
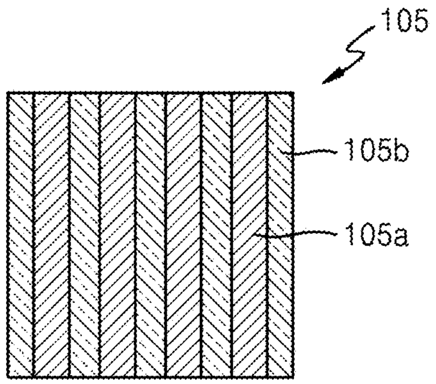

FIGS. 2A and 2B are respectively plan views illustrating the distributions of the regions within the gate insulating layer 105 of the field effect transistor 100 illustrated in FIG. 1 along the cross-sectional view line II-II' shown in FIG. 1, according to some example embodiments.

Referring to FIG. 2A, the first regions **105*a* may be spaced apart from each other and two-dimensionally arranged within the plane of the gate insulating layer 105, that is, in a horizontal direction parallel to the upper surface of the channel 104 or the lower surface of the gate electrode 106. In addition, at least one second region 105*b* may be arranged between the first regions 105*a* on the same plane as the first regions 105*a*. Accordingly, one first region 105*a* may be separated from another first region 105*a* adjacent thereto by the second region 105*b*. For example, a second region 105*b* may be between at least two adjacent first regions 105*a* of the plurality of first regions 105*a*, such that the at least two adjacent first regions 105*a* are separated from each other. Although FIG. 2A illustrates that the first regions 105*a* have a circular shape in a horizontal plane, this is only an example, and the first regions 105*a* may have various other shapes. For example, the first regions 105*a* may have an elliptical shape or a polygonal shape, such as a rectangular shape. In addition, the first regions 105*a* may have different sizes or shapes from each other. Furthermore, the first regions 105*a*** may be arranged regularly or irregularly.

Referring to FIG. 2B, the gate insulating layer 105 may include a plurality of first regions **105*a* having a stripe shape in a horizontal plane extending in a first direction (e.g., a horizontal direction), and a plurality of second regions 105*b* having a stripe shape extending in the first direction. The first regions 105*a* and the second regions 105*b* may be alternately arranged in a second direction perpendicular to the first direction within the plane of the gate insulating layer 105 (e.g., a second horizontal direction that is parallel to the upper surface of the channel 104 or the lower surface of the gate electrode 106). Accordingly, one first region 105*a* may be separated from another first region 105*a* adjacent thereto by at least one second region 105*b*. In addition, one second region 105*b* may be separated from another second region 105*b* adjacent thereto by at least one first region 105*a***.

In some example embodiments, the gate electrode 106 may include first pattern regions P1 and second pattern regions P2 respectively matching (e.g., overlapping in a vertical direction that is perpendicular to the upper surface of the channel 104 or the lower surface of the gate electrode 106) the first regions **105*a* and the second regions 105*b* of the gate insulating layer 105. The first pattern regions P1 and the second pattern regions P2 may include the same conductive material and may be distinguished by a step. The size and shape of the first pattern region P1 may match the size and shape of the first region 105*a* of the gate insulating layer 105, and the size and shape of the second pattern region P2 may match the size and shape of the second region 105*b* of the gate insulating layer 105. For example, like the first regions 105*a* and the second regions 105*b* of the gate insulating layer 105 illustrated in FIG. 2A, the first pattern regions P1 may be spaced apart from each other and two-dimensionally arranged, and the second pattern region P2 may be arranged between the first pattern regions P1. In some example embodiments, like the first regions 105*a* and the second regions 105*b* of the gate insulating layer 105 illustrated in FIG. 2B, the first pattern regions P1 having a stripe shape and the second pattern regions P2 having a stripe shape may be alternately arranged in the second direction. The first pattern region P1 and the first region 105*a* may be in direct contact with each other in a vertical direction (i.e., a third direction that is perpendicular to the upper surface of the channel 104 or the lower surface of the gate electrode 106), and the second pattern region P2 and the second region 105***b* may be in direct contact with each other in the third direction.

The first pattern regions P1 and the second pattern regions P2 of the gate electrode 106 may be formed in the process of forming the first regions 105*a* and the second regions 105*b* of the gate insulating layer 105 according to a method illustrated in FIGS. 5A to 5C to be described below. Although FIG. 1 illustrates that the upper surface of the first pattern region P1 is higher (e.g., further from the substrate 101 in the vertical direction) than the upper surface of the second pattern region P2, the present inventive concepts are not limited thereto. For example, the upper surface of the second pattern region P2 may be higher than the upper surface of the first pattern region P1.

According to some example embodiments, the size, shape, arrangement, number, and composition of the first regions 105*a* and the second regions 105*b* in the gate insulating layer 105 may be controlled so that the gate insulating layer 105 has optimal or improved negative capacitance characteristics. For example, in the example of FIG. 2A, the area of each of the first regions 105*a* (e.g., a cross-sectional area of each first region 105*a* of the first regions in a horizontal plane that is parallel to the upper surface of the channel 104 or the lower surface of the gate electrode 106) may be, for example, greater than or equal to about 0.25 $nm^2$ and less than or equal to about 1 μm. In addition, in the example of FIG. 2B, the width of each of the first and second regions 105*a* and 105*b* in the second direction may be greater than or equal to about 0.5 nm and less than or equal to about 1 μm. The thickness of the gate insulating layer 105 in the third direction perpendicular to the first and second directions may be greater than or equal to about 0.5 nm and less than or equal to about 50 nm.

In addition, according to some example embodiments, the first region 105*a* may be a domain-controlled region where a ferroelectric crystal structure is dominant, and the second region 105*b* may be a domain-controlled region where a non-ferroelectric (e.g., paraelectric, antiferroelectric, or amorphous) structure is dominant. In some example embodiments, a region where a ferroelectric crystal structure is dominant is a region, structure, layer, or the like in which the ferroelectric crystal structure comprises a majority (e.g., the proportion of the ferroelectric crystal structure is more than 50%) by volume and/or mass of the total material composition of the region, structure, layer, or the like and the non-ferroelectric crystal structure comprises a minority (e.g., the proportion of the non-ferroelectric crystal structure is less than 50%) by volume and/or mass of the total material composition of the region, structure, layer, or the like. In some example embodiments, a region where a non-ferroelectric crystal structure is dominant is a region, structure, layer, or the like in which the non-ferroelectric crystal structure comprises a majority (e.g., the proportion of the non-ferroelectric crystal structure is more than 50%) by volume and/or mass of the total material composition of the region, structure, layer, or the like and the ferroelectric crystal structure comprises a minority (e.g., the proportion of the ferroelectric crystal structure is less than 50%) by volume and/or mass of the total material composition of the region, structure, layer, or the like. For example, in the first region 105*a*, the proportion of the ferroelectric crystal structure may be about 65 at % or more or about 80 at % or more and the proportion of the non-ferroelectric structure may be about 35 at % or less or about 20 at % or less. In addition, in the second region 105*b*, the proportion of the ferroelectric crystal structure may be about 35 at % or less or about 20 at % or less and the proportion of the non-ferroelectric structure may be about 65 at % or more or about 80 at % or more. In another example, in the first region 105*a*, the proportion of the ferroelectric crystal structure may be about 51 at % or more or and the proportion of the non-ferroelectric structure may be about 49 at % or less, and, in the second region 105*b*, the proportion of the ferroelectric crystal structure is about 49 at % or less and the proportion of the non-ferroelectric structure may be about 51 at % or more. In some example embodiments, the first region 105*a* may be a domain-controlled region where a non-ferroelectric structure is dominant, and the second region 105*b* may be a domain-controlled region where a ferroelectric crystal structure is dominant. It will be understood that, in a region where the ferroelectric crystal structure is dominant, the proportion of the non-ferroelectric structure may be about 0.01 at % or more, 0.1 at % or more, 1 at % or more, or the like. It will be understood that, in a region where the non-ferroelectric crystal structure is dominant, the proportion of the ferroelectric structure may be about 0.01 at % or more, 0.1 at % or more, 1 at % or more, or the like.

Figure 3:
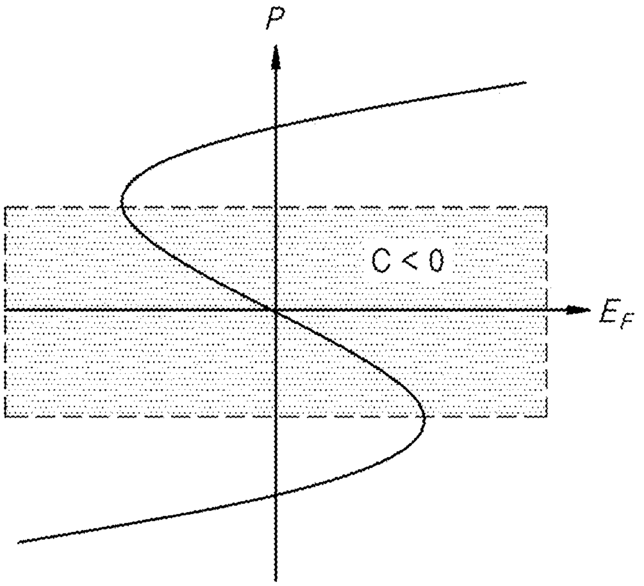
FIG. 3 is a graph showing a relationship between an electric field and polarization in a region where a domain-controlled ferroelectric crystal structure is dominant or in a domain boundary between a region where a ferroelectric crystal structure is dominant and a region where a non-ferroelectric structure is dominant according to some example embodiments.

FIG. 3 is a graph showing a relationship between electric field and polarization in a region where a domain-controlled ferroelectric crystal structure is dominant or in a domain boundary between a region where a ferroelectric crystal structure is dominant and a region where a non-ferroelectric structure is dominant according to some example embodiments. In FIG. 3, the horizontal axis represents the intensity of electric field applied to the region where the ferroelectric crystal structure is dominant or to the domain boundary between the region where the ferroelectric crystal structure is dominant and the region where the non-ferroelectric structure is dominant, and the vertical axis represents the intensity of polarization in the region where the ferroelectric crystal structure is dominant or in the domain boundary between the region where the ferroelectric crystal structure is dominant and the region where the non-ferroelectric structure is dominant. A relationship between the intensity of electric field applied to the gate insulating layer 105 and the intensity of net polarization of the entire gate insulating layer 105 may be similar to the relationship between electric field and polarization illustrated in the graph of FIG. 3. Referring to FIG. 3, a change in intensity of electric field and a change in intensity of polarization are opposite to each other in a section, indicated by a dashed line box, in which a direction of polarization is inverted. In other words, in the section indicated by the dashed box, the direction of electric field and the direction of polarization are opposite to each other, and the intensity of polarization gradually decreases as the intensity of electric field increases, or the intensity of polarization gradually increases as the intensity of electric field decreases. Accordingly, the gate insulating layer 105 may have negative capacitance.

Figure 4:
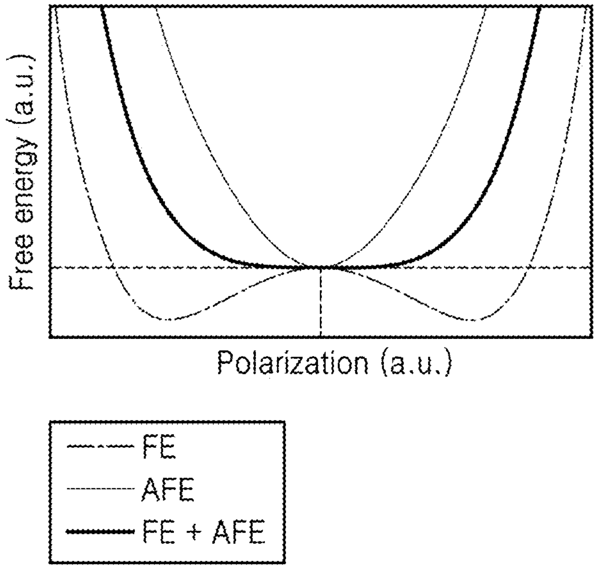
FIG. 4 is a graph showing a comparison of relationships between free energy and polarization in a domain-controlled gate insulating layer, a pure ferroelectric material, and an antiferroelectric material according to some example embodiments.

FIG. 4 is a graph showing a comparison of relationships between free energy and polarization in a domain-controlled gate insulating layer, a pure ferroelectric material, and an antiferroelectric material according to some example embodiments. In FIG. 4, the horizontal axis represents the intensity of polarization, and the vertical axis represents free energy of the corresponding material. Referring to FIG. 4, the pure ferroelectric material (FE) has energy-polarization characteristics in which free energy is locally maximum at the point where the intensity of polarization is zero and two wells having locally minimum free energy are formed on both sides of the point where the intensity of polarization is zero. Therefore, the pure ferroelectric material (FE) becomes unstable at the point where the intensity of polarization is zero. The antiferroelectric material (AFE) has narrow parabolic energy-polarization characteristics in which free energy is locally minimum at the point where the intensity of polarization is zero. In some example embodiments, the domain-controlled gate insulating layer 105 (FE+AFE) has energy-polarization characteristics in which the graph of the FE and the graph of the AFE are appropriately combined. In particular, because a relatively wide low energy section is formed around the point where the intensity of polarization is zero, the domain-controlled gate insulating layer 105 may have a stable state even around the point where the intensity of polarization is zero. As a result, negative capacitance may appear in the region where the ferroelectric crystal structure is dominant or in the domain boundary between the region where the ferroelectric crystal structure is dominant and the region where the non-ferroelectric structure is dominant. The graph illustrated in FIG. 4 is only an example. When internal electric field exists in the gate insulating layer 105 due to traps or impurities included in the gate insulating layer 105 or between the gate insulating layer 105 and the channel 104 or due to the work function of the gate electrode 106 on the gate insulating layer 105, or the like, the positions of energy local minimum points or energy local maximum points illustrated in the graph of FIG. 4 may be changed.

In view of at least the above, it will be understood that a field effect transistor 100 may be configured to implement optimal or improved negative capacitance characteristics based on the field effect transistor 100 including at least a gate insulating layer 105 with a first region 105*a* where a ferroelectric crystal structure is dominant and a second region 105*b* where a non-ferroelectric structure is dominant, thereby configuring the field effect transistor 100 to have improved low power characteristics and leakage current characteristics, reduced power consumption, or the like. The field effect transistor 100 may thus have improved operation performance and/or efficiency, together with reduced size (e.g., improved downscaling, compactness, etc.) and thus may be configured to enable an electronic apparatus architecture, electronic device, or the like including the field effect transistor 100 to have improved operational performance and/or efficiency (e.g., improved low power characteristics and leakage current characteristics) together with improved downscaling (e.g., improved compactness).

Figure 5A:
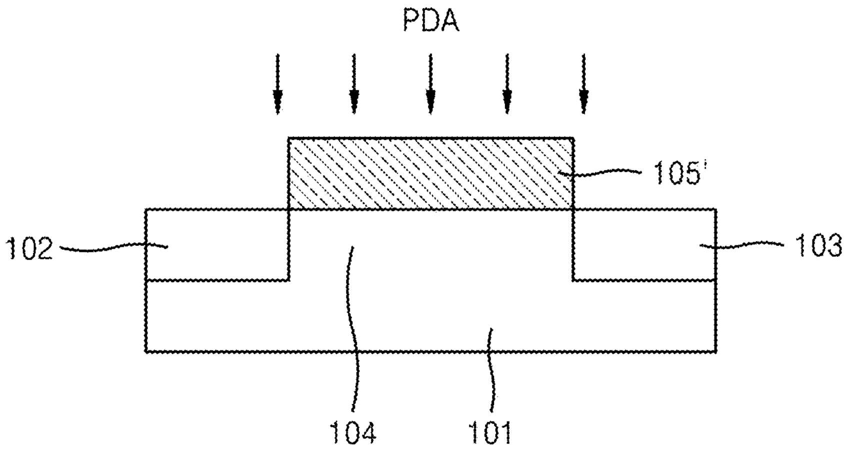
FIGS. 5A, 5B, and 5C are respectively cross-sectional views illustrating a part of a process of manufacturing the field effect transistor illustrated in FIG. 1 so as to control a distribution of regions in the gate insulating layer according to some example embodiments.
Figure 5B:
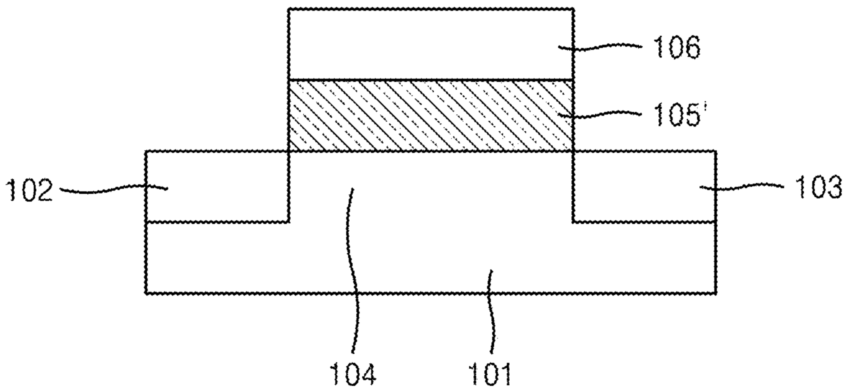
Figure 5C:
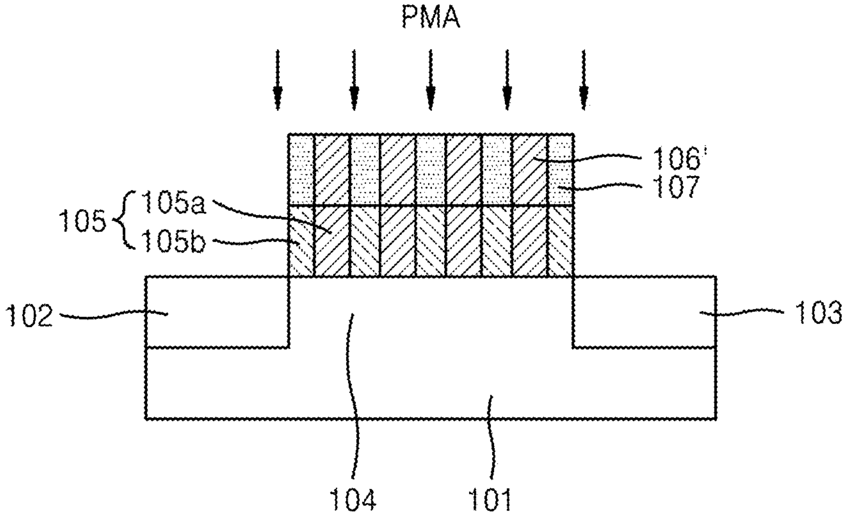
Figure 19:
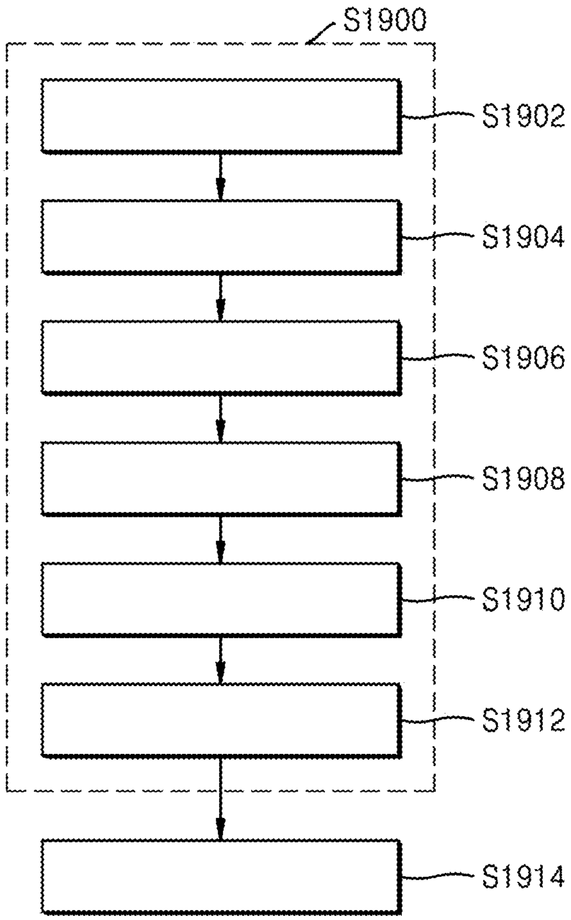
FIG. 19 is a flowchart showing a method according to some example embodiments.

FIGS. 5A, 5B, and 5C are respectively cross-sectional views illustrating a part of a process of manufacturing the field effect transistor 100 illustrated in FIG. 1 so as to control a distribution of regions in the gate insulating layer 105. FIG. 19 is a flowchart showing a method according to some example embodiments that includes a process S1900 of manufacturing the field effect transistor 100 illustrated in FIG. 1 so as to control a distribution of regions in the gate insulating layer 105.

Referring to FIG. 5A and FIG. 19, at S1902 the source region 102 and the drain region 103 may be formed by doping both sides of an upper portion of the substrate 101 according to a commonly known semiconductor manufacturing process. A gate insulating layer material 105' may be deposited on the channel 104 between the source region 102 and the drain region 103. For example, doped hafnium oxide may be formed by chemical vapor deposition (CVD), physical vapor deposition (PVD), or atomic layer deposition (ALD). Immediately after the deposition, the gate insulating layer material 105' may be in an amorphous state or may have a monoclinic crystal structure. At this time, the gate insulating layer material 105' may have paraelectric characteristics.

Thereafter, still referring to FIG. 5A and FIG. 19, at S1904 post deposition annealing (PDA) may be performed. The PDA may be performed at a temperature of about 1,000° C. or less. Due to the PDA, the gate insulating layer material 105' may have a tetragonal crystal structure or a mixed crystal structure in which the tetragonal crystal structure is more dominant. In this case, the gate insulating layer material 105' may have antiferroelectric characteristics or may have characteristics in which an antiferroelectric structure are dominant. In some example embodiments, a portion of the monoclinic crystals or the amorphous structure may remain in the gate insulating layer material 105' so that the gate insulating layer material 105' may have characteristics in which the antiferroelectric material and the paraelectric material are mixed. In some example embodiments, the ferroelectric crystal structure may be partially formed so that the gate insulating layer material 105' may have characteristics in which the antiferroelectric material and the ferroelectric material are mixed, or may have characteristics in which the antiferroelectric material, the paraelectric material, and the ferroelectric material are mixed. In any case, the gate insulating layer material 105' may have antiferroelectric characteristics as a whole or may have characteristics in which the antiferroelectric structure is dominant.

Referring to FIG. 5B and FIG. 19, after the PDA is performed, at S1906 the gate electrode 106 may be formed on the gate insulating layer material 105'. The gate electrode 106 may be formed by, for example, sputtering.

Referring to FIG. 5C and FIG. 19, at S1908 a plurality of gate electrode patterns 106' may be formed by patterning the gate electrode 106 on the gate insulating layer material 105'. For example, the gate electrode patterns 106' may be formed by partially removing the gate electrode 106 through etching. Accordingly, a portion of the gate insulating layer material 105' may be exposed to the outside between the gate electrode patterns 106'. A filler 107 including a metal material or a dielectric material that is different from a material of the gate electrode 106 may be formed between the gate electrode patterns 106'. In some example embodiments, a next process may be performed without filling other materials between the gate electrode patterns 106'.

Thereafter, still referring to FIG. 5C and FIG. 19, at S1910 post metallization annealing (PMA) may be performed. The PMA may be performed at a temperature of about 1,000° C. or less (e.g., a temperature of about 100° C. to about 1,000° C.). During the PMA process, strain applied to the gate insulating layer material 105' under the gate electrode pattern 106' and strain applied to the gate insulating layer material 105' between the gate electrode patterns 106' become different due to the difference in thermal expansion coefficient of the materials. As a result, the gate insulating layer material 105' under the gate electrode pattern 106' may have an orthorhombic crystal structure or a mixed crystal structure in which an orthorhombic crystal structure is dominant during or after the PMA process, whereas the gate insulating layer material 105' between the gate electrode patterns 106' may have a structure in which the crystal structure is unchanged or the crystal structure that is dominant before the PMA process is still dominant. Therefore, most of the gate insulating layer material 105' under the gate electrode pattern 106' has an orthorhombic crystal structure, and most of the gate insulating layer material 105' between the gate electrode patterns 106' has a monoclinic crystal structure, a tetragonal crystal structure, or an amorphous structure.

Then, as a result of the PMA process at S1910, most (e.g., more than 50% by volume and/or by mass) of the gate insulating layer material 105' under the gate electrode pattern 106' has ferroelectric characteristics, and most (e.g., more than 50% by volume and/or by mass) of the gate insulating layer material 105' between (e.g., horizontally between, vertically offset and exposed from, etc.) the gate electrode patterns 106' has antiferroelectric characteristics. Accordingly, the gate insulating layer 105 including the first region 105*a*, the domain of which is controlled so that the ferroelectric crystal structure is dominant, and the second region 105*b*, the domain of which is controlled so that the non-ferroelectric structure is dominant may be formed. For example, in the first region 105*a*, the proportion of the orthorhombic crystals may be about 65 at % or more or about 80 at % or more and the proportion of the sum of the monoclinic crystals, the tetragonal crystals, and the amorphous structure may be about 35 at % or less or about 20 at % or less. In addition, in the second region 105*b*, the proportion of the orthorhombic crystals is about 35 at % or less or about 20 at % or less, and the proportion of the sum of the monoclinic crystals, the tetragonal crystals, and the amorphous structure may be about 65 at % or more or about 80 at % or more. In another example, in the first region 105*a*, the proportion of the orthorhombic crystals may be about 51 at % or more and the proportion of the sum of the monoclinic crystals, the tetragonal crystals, and the amorphous structure may be about 49 at % or less, and, in the second region 105*b*, the proportion of the orthorhombic crystals is about 49 at % or less and the proportion of the sum of the monoclinic crystals, the tetragonal crystals, and the amorphous structure may be about 51 at % or more. It will be understood that, in a region where the proportion of the orthorhombic crystals is about 51 at % or more, the proportion of the sum of the monoclinic crystals, the tetragonal crystals, and the amorphous structure may be about 0.01 at % or more, 0.1 at % or more, 1 at % or more, or the like. It will be understood that, in a region where the proportion of the sum of the monoclinic crystals, the tetragonal crystals, and the amorphous structure is about 51 at % or more, the proportion of the orthorhombic crystals may be about 0.01 at % or more, 0.1 at % or more, 1 at % or more, or the like.

However, the present inventive concepts are not necessarily limited thereto, the position where the crystal structure of the gate insulating layer material 105' changes may vary depending on the thermal expansion coefficient of the gate electrode pattern 106' and the thermal expansion coefficient of the material of the filler 107 between the gate electrode patterns 106'. For example, when tensile stress applied to the gate insulating layer material 105' by the material of the filler 107 between the gate electrode patterns 106' is greater than tensile stress applied to the gate insulating layer material 105' by the gate electrode pattern 106', the crystal structure of the gate insulating layer material 105' under the gate electrode pattern 106' may hardly change during the PMA process, and the crystal structure of the gate insulating layer material 105' between the gate electrode patterns 106' may change to an orthorhombic crystal structure. In this case, the non-ferroelectric structure may be dominant in the first region 105*a* under the gate electrode pattern 106', and the ferroelectric crystal structure may be dominant in the second region 105*b* between the gate electrode patterns 106'.

After the gate insulating layer 105 is formed, still referring to FIG. 5C and FIG. 19, at S1912 the gate electrode 106 may be completed by filling the material of the gate electrode 106 between the gate electrode patterns 106'. When the filler 107 that is different from the material of the gate electrode 106 is filled between the gate electrode patterns 106', the material of the gate electrode 106 may be filled after the filler 107 is removed. In this process, the gate electrode 106 may have the first pattern region P1 and the second pattern region P2 having different heights from each other, as illustrated in FIG. 1.

While the process S1902 is described above with reference to manufacturing a field effect transistor as shown in FIG. 1, it will be understood that the process S1902 may be used to manufacture any field effect transistor according to any of the example embodiments. In addition, it will be understood that devices other than field effect transistors, including for example a capacitor according to any of the example embodiments, an electronic apparatus according to any of the example embodiments, or the like may be manufactured based at least in part upon the process S1902.

Figure 17:
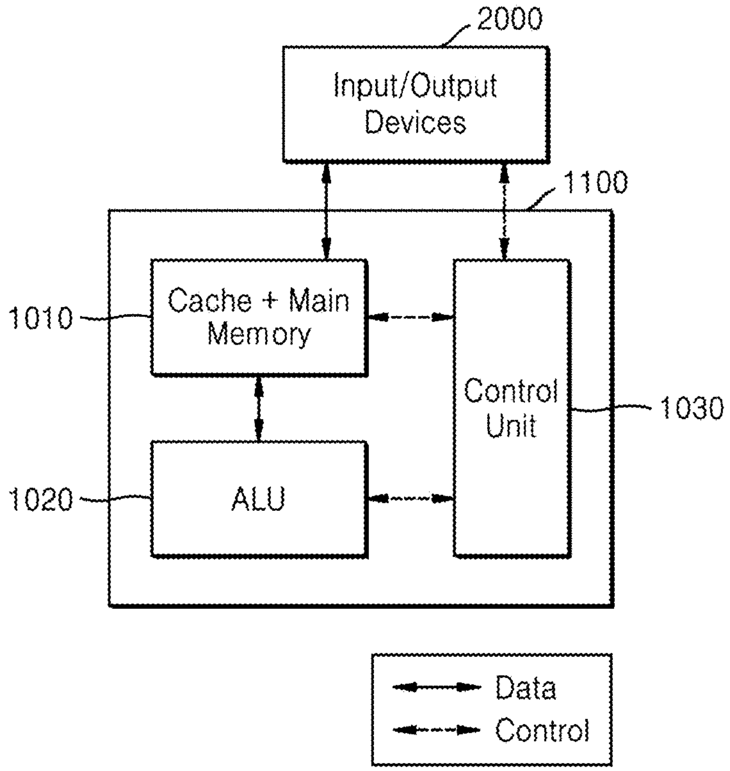
FIGS. 17 and 18 are respectively conceptual diagrams schematically illustrating a device architecture applicable to an apparatus, according to some example embodiments.
Figure 18:
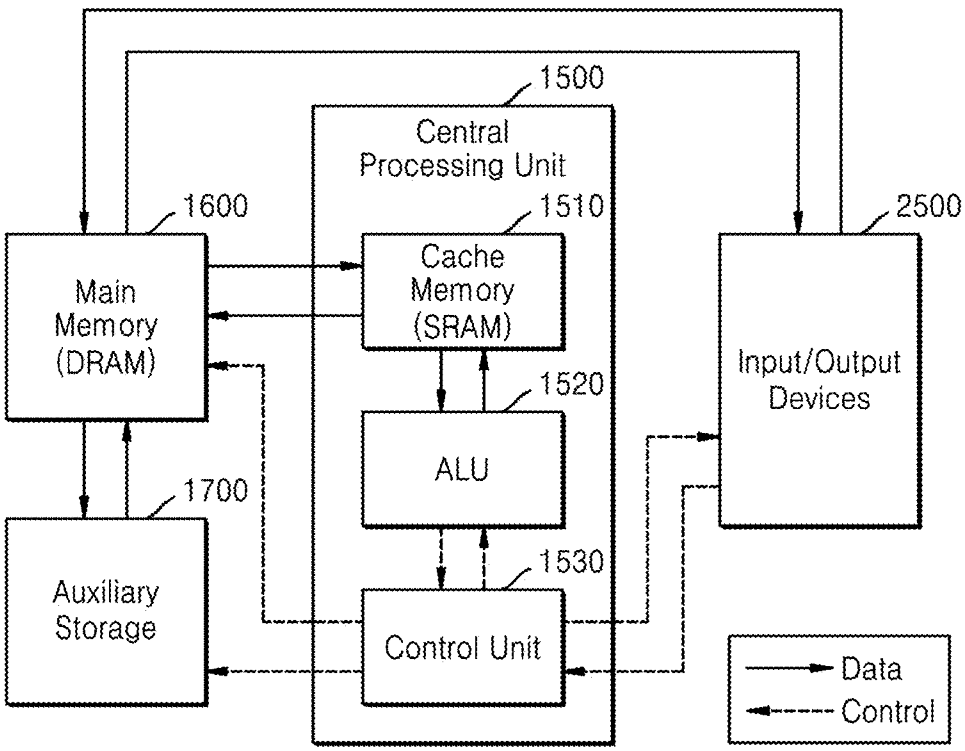

Still referring to FIG. 19, at least one device at least partially manufactured at S1902 may be a device according to any of the example embodiments which includes a domain-controlled ferroelectric material (e.g., a field effect transistor according to any of the example embodiments, a capacitor according to any of the example embodiments, an electronic apparatus according to any of the example embodiments, or the like). At S1914, the at least one device at least partially manufactured at S1902 may be incorporated (e.g., applied) into the assembly of an electronic device, including for example an electronic device including any of the electronic apparatus architectures according to any of the example embodiments, to at least partially manufacture the electronic device. For example, at S1914 the at least one device at least partially manufactured at S1902 may be incorporated into an electronic apparatus architecture or any portion thereof (e.g., any portion of the electronic apparatus architectures, devices thereof, or the like as shown in FIGS. 17-18), for example into at least one of the memory unit 1010, the ALU 1020, or the control unit 1030 of the electronic apparatus architecture (chip) 1100 shown in FIG. 17. In addition, at S1914 the at least one device at least partially manufactured at S1902 and/or the electronic apparatus architecture including same (e.g., electronic apparatus architecture (chip) 1100) may be incorporated into the assembly of an electronic device, including for example a smartphone, a computer, a laptop, a camera, any combination thereof, or the like, such that the electronic device is manufactured to include the device at least partially manufactured at S1902. As a result, an electronic device configured to have improved low power characteristics and leakage current characteristics may be manufactured based on being manufactured to include at least one device at least partially manufactured at S1902 may be at least one device according to any of the example embodiments (e.g., a field effect transistor, a capacitor, an electronic apparatus, any combination thereof, or the like) which includes a domain-controlled ferroelectric material and may be configured to implement optimal or improved negative capacitance characteristics.

Figure 6:
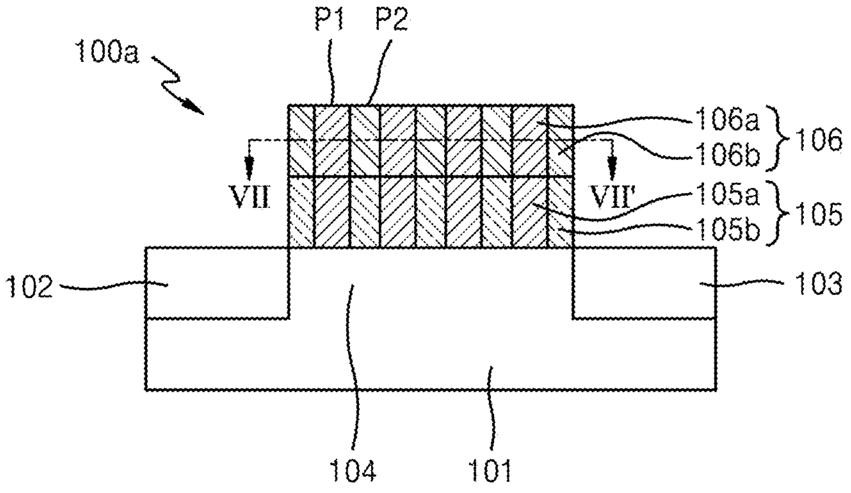
FIG. 6 is a cross-sectional view schematically illustrating a structure of a field effect transistor according to some example embodiments.

FIG. 6 is a cross-sectional view schematically illustrating a structure of a field effect transistor 100*a* according to some example embodiments. In the process illustrated in FIG. 5C, when the filler 107 filled between the gate electrode patterns 106' is a material having excellent conductivity, the material of the gate electrode 106 may not be filled between the gate electrode patterns 106'. In this case, referring to FIG. 6, the gate electrode 106 of the field effect transistor 100*a* may include first conductive materials 106*a* and second conductive materials 106*b* between the first conductive materials 106*a*. The first conductive material 106*a* and the second conductive material 106*b* may include materials different from each other. In particular, the first conductive material

106*a* and the second conductive material 106*b* may include materials having different thermal expansion coefficients from each other. In this case, the first conductive material 106*a* may form the first pattern region P1, and the second conductive material 106*b* may form the second pattern region P2. In other words, the first pattern region P1 may include the first conductive material 106*a*, and the second pattern region P2 may include the second conductive material 106*b* having a thermal expansion coefficient that is different from a thermal expansion coefficient of the first conductive material 106*a*.

The first conductive material 106*a* may be disposed above the first region 105*a* of the gate insulating layer 105, and the second conductive material 106*b* may be disposed above the second region 105*b* of the gate insulating layer 105. In other words, the first conductive material 106*a* and the first region 105*a* are in direct contact with each other in the vertical direction (i.e., the third direction), and the second conductive material 106*b* and the second region 105*b* may be in direct contact with each other in the third direction. Accordingly, the arrangement of the first conductive material 106*a* and the second conductive material 106*b* may be the same as the arrangement of the first region 105*a* and the second region 105*b*. The first conductive material 106*a* and the second conductive material 106*b* may be arranged within the plane of the gate electrode 106. In other words, the first conductive material 106*a* and the second conductive material 106*b* may be arranged in a direction parallel to the upper surface of the gate insulating layer 105 that is in contact with the gate electrode 106.

Figure 7A:
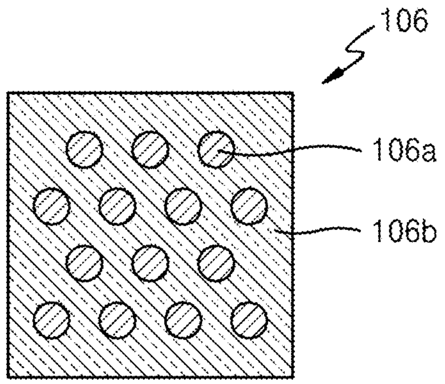
FIGS. 7A and 7B are respectively plan views illustrating structures of a gate electrode in the field effect transistor illustrated in FIG. 6 according to some example embodiments.
Figure 7B:
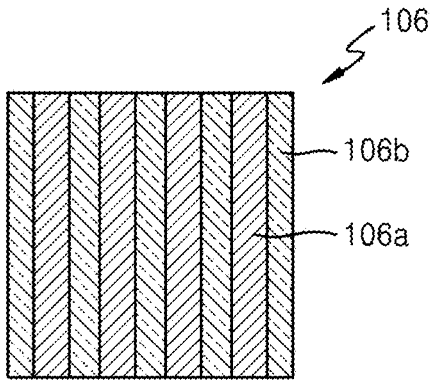

For example, FIGS. 7A and 7B are respectively plan views illustrating the structures of the gate electrode 106 in the field effect transistor 100*a* illustrated in FIG. 6 along the cross-sectional view line VII-VII' shown in FIG. 6, according to some example embodiments.

Referring to FIG. 7A, the first conductive materials 106*a* may be spaced apart from each other and two-dimensionally arranged within the plane of the gate electrode 106, that is, in a horizontal direction parallel to the upper surface of the gate insulating layer 105. In addition, one second conductive material 106*b* may be between the first conductive materials 106*a* on the same plane as the first conductive materials 106*a*. Accordingly, one first conductive material 106*a* may be separated from another first conductive material 106*a* adjacent thereto by the second conductive material 106*b*. Although FIG. 7A illustrates that the first conductive materials 106*a* have a circular shape, this is only an example, and the first conductive materials 106*a* may have various other shapes. For example, the first conductive materials 106*a* may have an elliptical shape or a polygonal shape, such as a rectangular shape. In addition, the first conductive materials 106*a* may have different sizes or shapes from each other. Furthermore, the first conductive materials 106*a* may be arranged regularly or irregularly.

The first conductive materials 106*a* may be deposited in the process illustrated in FIG. 5B and then patterned in the process illustrated in FIG. 5C, and the second conductive materials 106*b* may be filled between the gate electrode patterns 106' in the process illustrated in FIG. 5C. However, the present inventive concepts is not necessarily limited thereto. For example, in the process illustrated in FIG. 5C, the gate electrode pattern 106' may be formed to have a plurality of holes, and the holes may be additionally filled with a conductive material. In this case, the second conductive materials 106*b* may be deposited in the process illustrated in FIG. 5B and then patterned in the process illustrated in FIG. 5C, and the first conductive materials 106*a* may be filled between the gate electrode patterns 106' in the process illustrated in FIG. 5C.

In addition, referring to FIG. 7B, the gate electrode 106 may include a plurality of first conductive materials 106*a* having a stripe shape extending in a first direction, and a plurality of second conductive materials 106*b* having a stripe shape extending in the first direction. The first conductive materials 106*a* and the second conductive materials 106*b* may be alternately arranged in a second direction perpendicular to the first direction within the plane of the gate electrode 106. The first and second directions may be horizontal directions that are parallel to the upper surface of the gate insulating layer 105. Accordingly, one first conductive material 106*a* may be separated from another first conductive material 106*a* adjacent thereto by the second conductive material 106*b*. In addition, one second conductive material 106*b* may be separated from another second conductive material 106*b* adjacent thereto by the first conductive material 106*a*.

Figure 8:
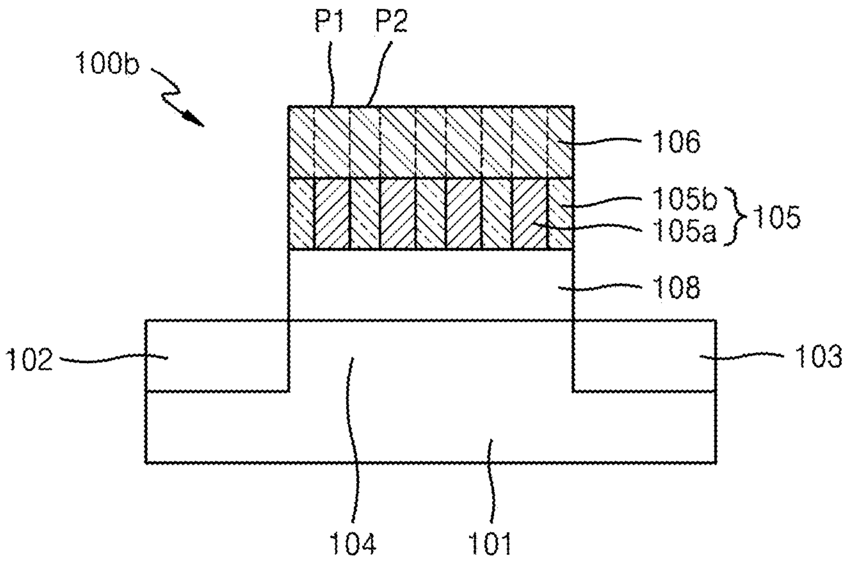
FIG. 8 is a cross-sectional view schematically illustrating a structure of a field effect transistor according to some example embodiments.

FIG. 8 is a cross-sectional view schematically illustrating a structure of a field effect transistor 100*b* according to some example embodiments. Referring to FIG. 8, the field effect transistor 100*b* may further include a non-ferroelectric layer 108 between the channel 104 and the gate insulating layer 105. The non-ferroelectric layer 108 may include at least one of a paraelectric material, an antiferroelectric material, or an amorphous material. In particular, the non-ferroelectric layer 108 may include a material whose crystal structure is not changed during a PMA process or a material that does not have ferroelectric characteristics even when the crystal structure is changed during a PMA process. When the non-ferroelectric layer 108 is disposed in contact with the gate insulating layer 105, a low energy section near an origin where the intensity of polarization is zero in the graph illustrated in FIG. 4 may be further flattened. Accordingly, the stability of the gate insulating layer 105 may be further improved in the vicinity of the point where the intensity of polarization is zero.

Figure 9:
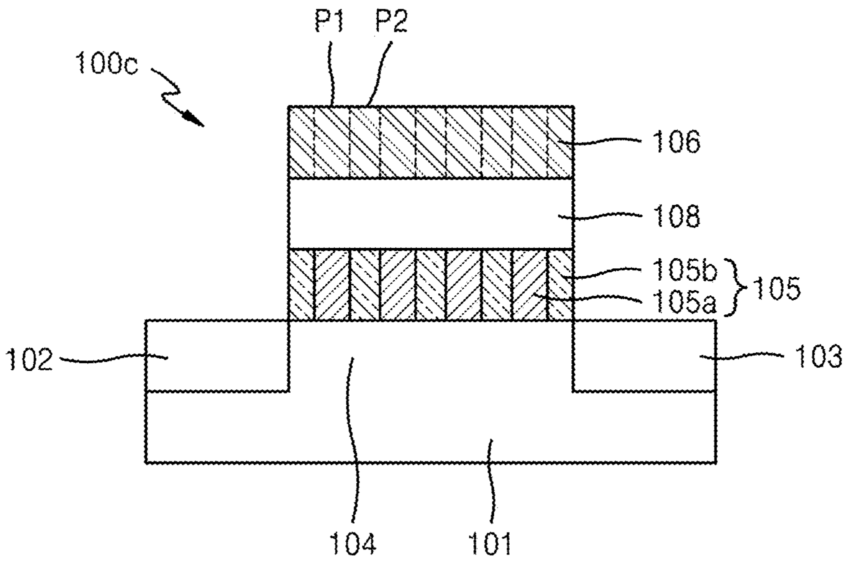
FIG. 9 is a cross-sectional view schematically illustrating a structure of a field effect transistor according to some example embodiments.

FIG. 9 is a cross-sectional view schematically illustrating a structure of a field effect transistor 100*c* according to some example embodiments. Referring to FIG. 9, the field effect transistor 100*c* may further include a non-ferroelectric layer 108 between the gate insulating layer 105 and the gate electrode 106. The field effect transistor 100*b* illustrated in FIG. 8 and the field effect transistor 100*c* illustrated in FIG. 9 differ from each other only in the position of the non-ferroelectric layer 108. In the case of some example embodiments, including the example embodiments illustrated in FIG. 9, the gate insulating layer 105 is not in direct contact with the gate electrode 106. Even in this case, the crystal structure of the gate insulating layer material 105' under the non-ferroelectric layer 108 may be changed during the PMA process to form the gate insulating layer 105. Therefore, even in some example embodiments, including the example embodiments illustrated in FIG. 9, the first region 105*a* and the second region 105*b* of the gate insulating layer 105 may be respectively arranged to match the first pattern region P1 and the second pattern region P2 of the gate electrode 106. For example, the first region 105*a* of the gate insulating layer 105 may be arranged to face the first pattern region P1 of the gate electrode 106 in the third direction, and the second region 105*b* of the gate insulating layer 105 may be arranged to face the second pattern region P2 of the gate electrode 106 in the third direction.

Although the field effect transistors 100, 100*a*, 100*b*, and 100*c* are illustrated as having the planar channel 104, the present inventive concepts are not necessarily limited thereto. For example, the principle described above may also be applied to a fin field effect transistor (FinFET), a gate-all-around FET (GAAFET), or a multi bridge channel FET (MBCFET) each having a three-dimensional channel structure.

Figure 10:
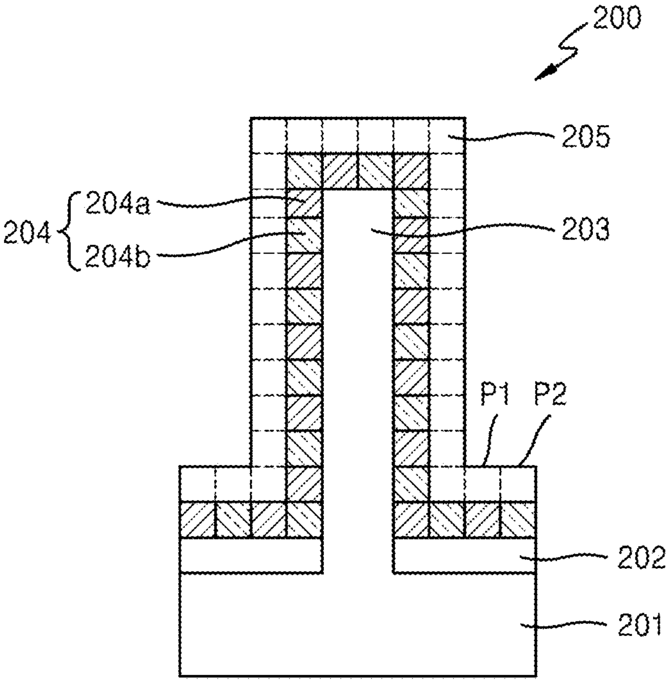
FIG. 10 is a cross-sectional view schematically illustrating a structure of a gate in a field effect transistor, according to some example embodiments.

FIG. 10 is a cross-sectional view schematically illustrating a structure of a gate in a field effect transistor 200, according to some example embodiments. Referring to FIG. 10, the field effect transistor 200 may include a substrate 201, a channel 203 having a rod shape protruding and extending from the upper surface of the substrate 201 in the third direction (e.g., vertical direction), a gate insulating layer 204 covering and surrounding three sides of the channel 203, and a gate electrode 205 covering and surrounding three sides of the gate insulating layer 204. In addition, the field effect transistor 200 may further include an isolation layer 202 between the upper surface of the substrate 201 and the gate insulating layer 204. The gate insulating layer 204 may include a plurality of first regions 204*a* arranged in a direction parallel to the surface of the channel 203 and a plurality of second regions 204*b* arranged between the first regions 204*a*. The first and second regions 204*a* and 204*b* may have the same configurations as the first and second regions 105*a* and 105*b* described above. In addition, the gate electrode 205 may include first pattern regions P1 facing the first regions 204*a* of the gate insulating layer 204, and second pattern regions P2 facing the second regions 204*b* of the gate insulating layer 204. When the first pattern regions P1 and the second pattern regions P2 include the same material, the first pattern regions P1 and the second pattern regions P2 may be distinguished by a step difference. In some example embodiments, the first pattern regions P1 and the second pattern regions P2 may include different conductive metal materials from each other. In some example embodiments, although not illustrated in FIG. 10, the field effect transistor 200 may further include a source region and a drain region continuously extending from the channel 203.

Figure 11:
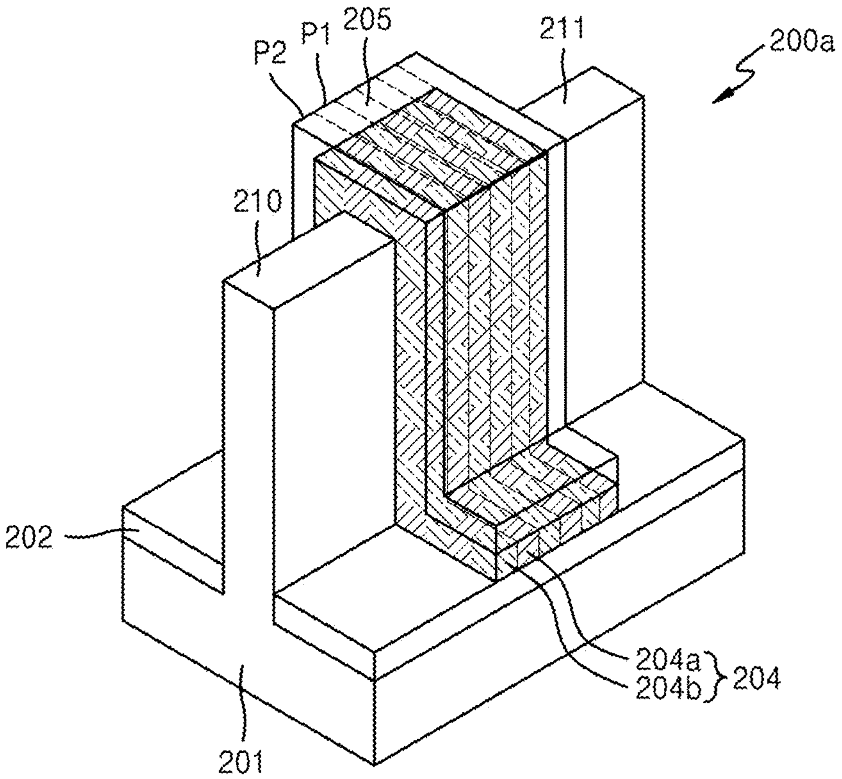
FIG. 11 is a perspective view schematically illustrating a structure of a field effect transistor according to some example embodiments.

FIG. 11 is a perspective view schematically illustrating a structure of a field effect transistor 200*a* according to some example embodiments. Referring to FIG. 11, the field effect transistor 200*a* may include a substrate 201, a channel having a rod shape protruding and extending from the upper surface of the substrate 201 in a third direction, a rod-shaped source region 210 protruding and extending from the upper surface of the substrate 201 in the third direction and having a rod shape extending from a first side surface of the channel in a second direction, a drain region 211 protruding and extending from the upper surface of the substrate 201 in the third direction and having a rod shape extending from a second side surface opposite to the first side surface of the channel in the second direction, a gate insulating layer 204 covering and surrounding three sides of the channel, and a gate electrode 205 covering and surrounding three sides of the gate insulating layer 204. The channel of the field effect transistor 200*a* illustrated in FIG. 11 may be the same as the channel 203 of the field effect transistor 200 illustrated in FIG. 10. In addition, the source region 210 and the drain region 211 of the field effect transistor 200*a* illustrated in FIG. 11 may be the same as the source region and the drain region of the field effect transistor 200 illustrated in FIG. 10.

The field effect transistor 200*a* illustrated in FIG. 11 may differ from the field effect transistor 200 illustrated in FIG. 10 only in the shapes of first regions 204*a* and second regions 204*b*. As illustrated in FIG. 11, the first regions 204*a* and the second regions 204*b* may extend along the surface of the channel in a stripe shape surrounding three sides of the channel, and may be alternately arranged in the second direction. In addition, like the first regions 204*a* and the second regions 204*b* of the gate insulating layer 204, first pattern regions P1 and second pattern regions P2 of the gate electrode 205 may also extend in a stripe shape surrounding three sides of the gate insulating layer 204.

Figure 12:
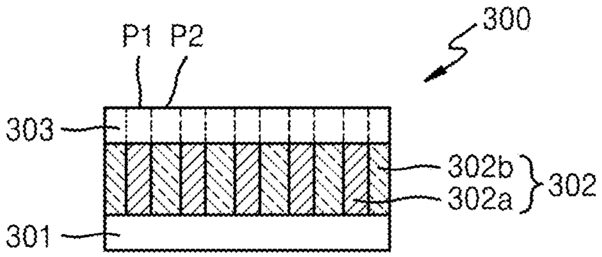
FIG. 12 is a cross-sectional view schematically illustrating a structure of a capacitor according to some example embodiments.

The domain-controlled ferroelectric material described above may also be applied not only to field effect transistors but also to other electronic apparatuses, such as capacitors. For example, FIG. 12 is a cross-sectional view schematically illustrating a structure of a capacitor 300 according to some example embodiments. Referring to FIG. 12, the capacitor 300 may include a first electrode 301, a second electrode 303 facing the first electrode 301, and a dielectric layer 302 between the first electrode 301 and the second electrode 303. The dielectric layer 302 may include a plurality of first regions 302*a* and a plurality of second regions 302*b*. The first regions 302*a* and the second regions 302*b* may be alternately arranged. The first regions 302*a* and the second regions 302*b* may be the same as the first regions 105*a* and the second regions 105*b* of each of the field effect transistors described above. In addition, the second electrode 303 may include first pattern regions P1 facing the first regions 302*a* of the dielectric layer 302 and second pattern regions P2 facing the second regions 302*b* of the dielectric layer 302. When the first pattern regions P1 and the second pattern regions P2 of the second electrode 303 include the same material, the first pattern regions P1 and the second pattern regions P2 may be distinguished by a step difference. In some example embodiments, the first pattern regions P1 and the second pattern regions P2 of the second electrode 303 may include different conductive metal materials from each other.

Figure 13A:
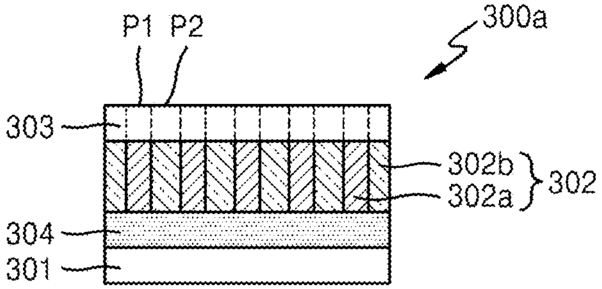
FIGS. 13A and 13B are respectively cross-sectional views schematically illustrating a structure of a capacitor according to some example embodiments.
Figure 13B:
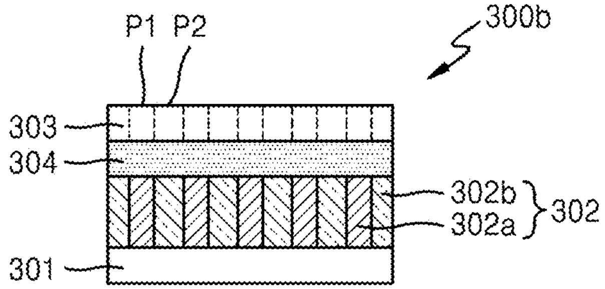

FIGS. 13A and 13B are respectively cross-sectional views schematically illustrating a structure of a capacitor according to some example embodiments. Referring to FIG. 13A, a capacitor 300*a* may further include a non-ferroelectric layer 304 between a first electrode 301 and a dielectric layer 302. The non-ferroelectric layer 304 may be the same as the non-ferroelectric layer 108 of each of the field effect transistors described above. In addition, referring to FIG. 13B, a capacitor 300*b* may include a non-ferroelectric layer 304 between a dielectric layer 302 and a second electrode 303.

The configurations and the manufacturing methods of the capacitors 300, 300*a*, and 300*b* illustrated in FIGS. 12, 13A, and 13B may mostly follow the configurations and the manufacturing methods (e.g., processes) of the field effect transistors described above with regard to at least S1902 in FIG. 19. For example, PDA may be performed after a material for the dielectric layer 302 is deposited, and PMA may be performed after the second electrode 303 is formed on the dielectric layer 302 and is patterned. Therefore, an orthorhombic crystal structure may be dominant in a plurality of first regions 302*a*, and a monoclinic crystal structure, a tetragonal crystal structure, or an amorphous structure may be dominant in a plurality of second regions 302*b*. The capacitors manufactured according to the methods of any of the example embodiments may be incorporated into a manufactured electronic device, as described above with reference to at least S1914 in FIG. 19. In addition, as in the gate electrodes 106 described with reference to FIGS. 6, 7A, and 7B, the second electrodes 303 of the capacitors 300, 300*a*, and 300*b* may include conductive materials having different thermal expansion coefficients from each other.

According to some example embodiments described above, the domains of the ferroelectric material may be easily controlled in a desired shape by patterning the electrode on the ferroelectric material and then performing PMA thereon. For example, the size, number, and distribution of the domains may be easily controlled according to the shape of the gate electrode pattern 106'. Therefore, negative capacitance characteristics may be improved through the domain control of the ferroelectric material. By using negative capacitance characteristics of the ferroelectric material, the field effect transistor, the capacitor, and the electronic apparatus (collectively, one or more devices according to any of the example embodiments), which are capable of being ultra-miniaturized with low power consumption and leakage current, may be provided. In view of at least the above, it will be understood that the field effect transistor, the capacitor, and the electronic apparatus (collectively, one or more devices according to any of the example embodiments) may be configured to implement optimal or improved negative capacitance characteristics based on the one or more devices including at least a gate insulating layer with a first region where a ferroelectric crystal structure is dominant and a second region where a non-ferroelectric structure is dominant, thereby configuring the one or more devices to have improved low power characteristics and leakage current characteristics, reduced power consumption, or the like. The one or more devices may thus have improved operation performance and/or efficiency, together with reduced size (e.g., improved downscaling, compactness, etc.) and thus may be configured to enable an electronic apparatus architecture, electronic device, or the like including the one or more devices to have improved operational performance and/or efficiency (e.g., improved low power characteristics and leakage current characteristics) together with improved downscaling (e.g., improved compactness, miniaturization, etc.).

Figure 14:
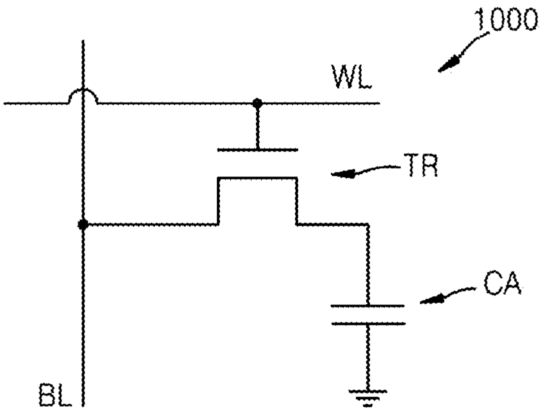
FIG. 14 is a circuit diagram for describing a schematic circuit configuration and operation of an electronic apparatus employing a capacitor, according to some example embodiments.

FIG. 14 is a circuit diagram for describing a schematic circuit configuration and operation of an electronic apparatus 1000 employing a capacitor, according to some example embodiments.

The circuit diagram of the electronic apparatus 1000 is for one cell of a dynamic random access memory (DRAM), and the electronic apparatus 1000 includes one transistor TR, one capacitor CA, a word line WL, and a bit line BL. The capacitor CA may be one of the capacitors 300, 300*a*, or 300*b* described with reference to FIGS. 12, 13A, and 13B.

A method of writing data to the DRAM is as follows. After a gate voltage (high) for turning the transistor TR on ("ON" state) is applied to a gate electrode through the word line WL, VDD (hereinafter, referred to as a "high voltage") or 0 (hereinafter, referred to as a "low voltage"), which is a data voltage value to be input, is applied to the bit line BL. When a high voltage is applied to the word line WL and the bit line BL, the capacitor CA is charged, that is, data "1" is written. When a high voltage is applied to the word line WL and a low voltage is applied to the bit line BL, the capacitor CA is discharged, that is, data "0" is written.

Upon reading data, a high voltage is applied to the word line WL to turn on the transistor TR of the DRAM, and a voltage of VDD/2 is applied to the bit line BL. When the data of the DRAM is "1," that is, when the voltage of the capacitor CA is VDD, charges stored in the capacitor CA slowly move to the bit line BL and the voltage of the bit line BL becomes slightly higher than VDD/2. In contrast, when the data of capacitor CA is "0," charges of the bit line BL move to the capacitor CA and the voltage of the bit line BL becomes slightly lower than VDD/2. A sense amplifier may sense and amplify the potential difference of the bit line and determine whether the data is "0" or "1."

Figure 15:
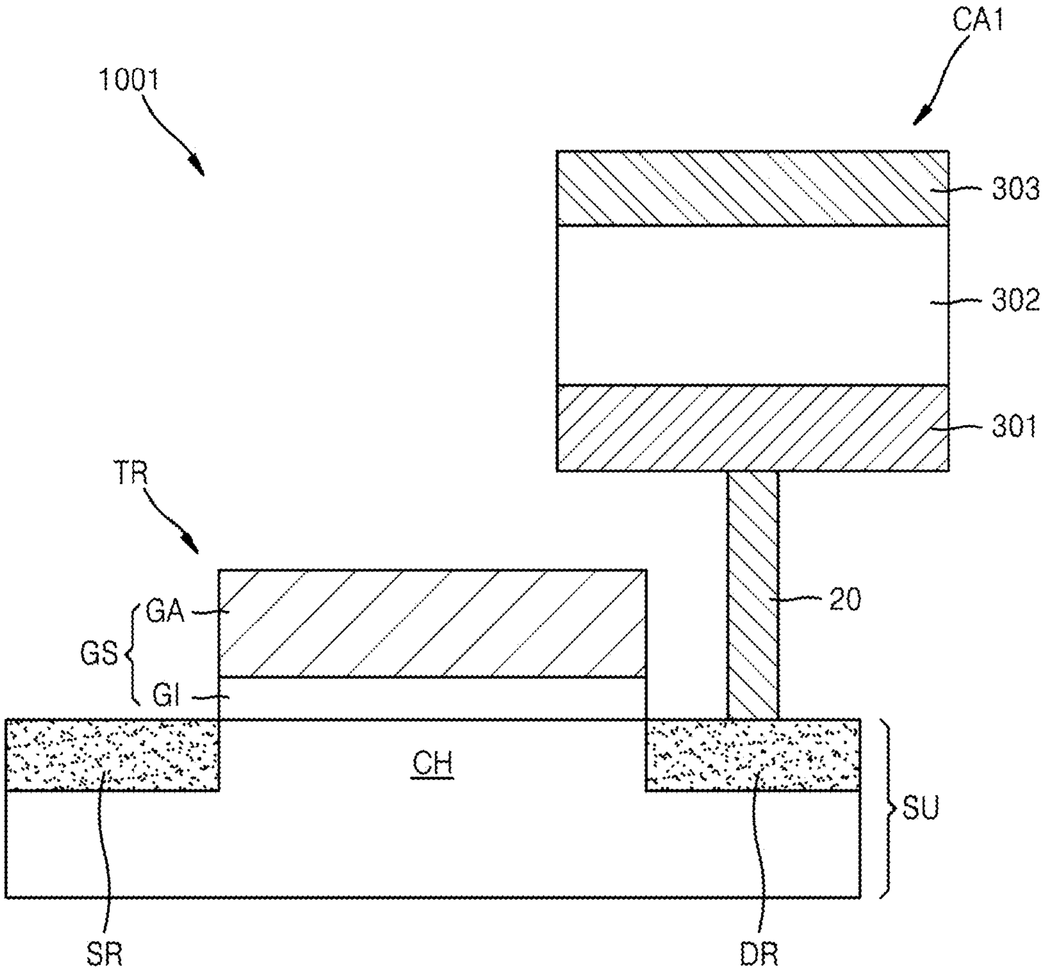
FIG. 15 is a schematic diagram illustrating an electronic apparatus according to some example embodiments.

FIG. 15 is a schematic diagram illustrating an electronic apparatus 1001 according to some example embodiments.

Referring to FIG. 15, the electronic apparatus 1001 may include a structure in which a capacitor CA1 and a transistor TR are electrically connected to each other through a contact 20. The capacitor CA1 includes a first electrode 301, a second electrode 303, and a dielectric layer 302 between the first electrode 301 and the second electrode 303. The capacitor CA1 may be one of the capacitors 300, 300*a*, or 300*b* described with reference to FIGS. 12, 13A, and 13B. Because this has been described above, detailed descriptions thereof are omitted.

The transistor TR may be a field effect transistor. The transistor TR includes a semiconductor substrate SU and a gate stack GS. The semiconductor substrate SU includes a source region SR, a drain region DR, and a channel CH. The gate stack GS is disposed on the semiconductor substrate SU, faces the channel CH, and includes a gate insulating layer GI and a gate electrode GA. The channel CH is a region between the source region SR and the drain region DR, and is electrically connected to the source region SR and the drain region DR. The source region SR may be electrically connected to or in contact with one end of the channel CH, and the drain region DR may be electrically connected to or in contact with the other end of the channel CH. The channel CH may be defined as a substrate region between the source region SR and the drain region DR in the semiconductor substrate SU. The transistor TR may be one of the field effect transistors described with reference to FIGS. 1, 6, and 8 to 10. Because this has been described above, detailed descriptions thereof are omitted.

One of the first electrode 301 or the second electrode 303 of the capacitor CA1 and one of the source region SR or the drain region DR of the transistor TR may be electrically connected to each other through the contact 20. The contact 20 may include an appropriate conductive material, for example, tungsten, copper, aluminum, or polysilicon.

The arrangement of the capacitor CA1 and the transistor TR may be variously modified. For example, the capacitor CA1 may be disposed on the semiconductor substrate SU, or may be buried in the semiconductor substrate SU. In addition, FIG. 15 illustrates that the electronic apparatus 1001 includes one capacitor CA1 and one transistor TR, but this is only an example, and the electronic apparatus 1001 may include a plurality of capacitors and a plurality of transistors.

Figure 16:
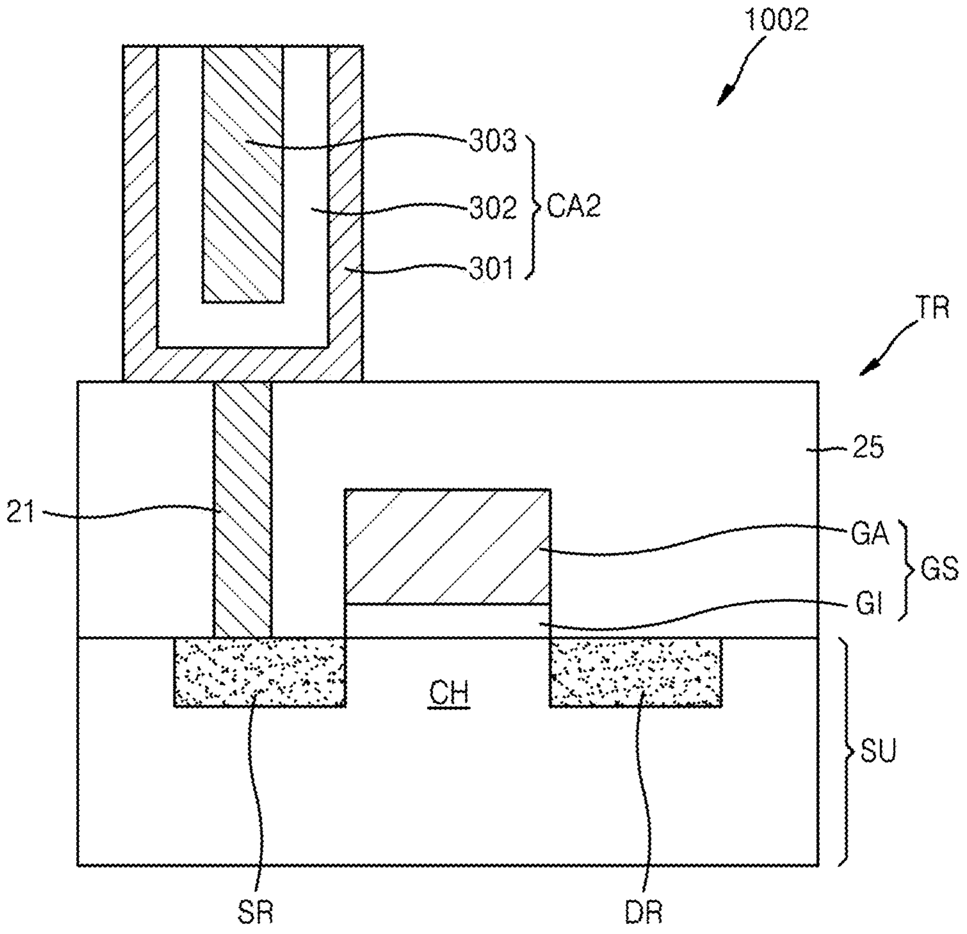
FIG. 16 is a schematic diagram illustrating an electronic apparatus according to some example embodiments.

FIG. 16 is a schematic diagram illustrating an electronic apparatus 1002 according to some example embodiments.

Referring to FIG. 16, the electronic apparatus 1002 may include a structure in which a capacitor CA2 and a transistor TR are electrically connected to each other through a contact 21. The transistor TR includes a semiconductor substrate SU and a gate stack GS. The semiconductor substrate SU includes a source region SR, a drain region DR, and a channel CH. The gate stack GS is disposed on the semiconductor substrate SU, faces the channel CH, and includes a gate insulating layer GI and a gate electrode GA.

An interlayer insulating layer 25 may be disposed on the semiconductor substrate SU to cover the gate stack GS. The interlayer insulating layer 25 may include an insulating material. For example, the interlayer insulating layer 25 may include Si oxide (e.g., $SiO_2$), Al oxide (e.g., $Al_2O_3$), or a high-k material (e.g., $HfO_2$). The contact 21 passes through the interlayer insulating layer 25 to electrically connect the transistor TR to the capacitor CA2.

The capacitor CA2 includes a first electrode 301, a second electrode 303, and a dielectric layer 302 between the first electrode 301 and the second electrode 303. The first and second electrodes 301 and 303 may be provided in a shape capable of increasing or maximizing the contact area with the dielectric layer 302. The capacitor CA2 may be one of the capacitors 300, 300*a*, or 300*b* described with reference to FIGS. 12, 13A, and 13B, and the transistor TR may be one of the field effect transistors described with reference to FIGS. 1, 6, and 8 to 10.

The capacitors, the field effect transistors, the electronic apparatuses, and the like, according to some example embodiments described above, may be applied to various application fields. For example, the electronic apparatuses according to some example embodiments may be applied as logic devices or memory devices. The electronic apparatuses according to some example embodiments may be used for arithmetic operations, program execution, temporary data retention, and the like in devices, such as mobile devices, computers, laptop computers, sensors, network devices, and neuromorphic devices. In addition, the electronic apparatuses according to some example embodiments may be useful for devices in which an amount of data transmission is large and data transmission is continuously performed.

FIGS. 17 and 18 are respectively conceptual diagrams schematically illustrating a device architecture applicable to an apparatus, according to some example embodiments.

Referring to FIG. 17, an electronic apparatus architecture (chip) 1100 may include a memory unit 1010, an arithmetic logic unit (ALU) 1020, and a control unit 1030. The memory unit 1010, the ALU 1020, and the control unit 1030 may be electrically connected to each other. For example, the electronic apparatus architecture (chip) 1100 may be implemented as a single chip including the memory unit 1010, the ALU 1020, and the control unit 1030.

The memory unit 1010, the ALU 1020, and the control unit 1030 may be interconnected in an on-chip manner via a metal line to perform direct communication. The memory unit 1010, the ALU 1020, and the control unit 1030 may be monolithically integrated on a single substrate to constitute a single chip. Input/output devices 2000 may be connected to the electronic apparatus architecture (chip) 1100. In addition, the memory unit 1010 may include both a main memory and a cache memory. The electronic apparatus architecture (chip) 1100 may be an on-chip memory processing unit. The memory unit 1010 may include the capacitor and the electronic apparatus including the same, which have been described above. The ALU 1020 or the control unit 1030 may also include the capacitor described above.

Referring to FIG. 18, a cache memory 1510, an ALU 1520, and a control unit 1530 may constitute a central processing unit (CPU) 1500. The cache memory 1510 may include a static random access memory (SRAM). Apart from the CPU 1500, a main memory 1600 and an auxiliary storage 1700 may be provided. The main memory 1600 may be a DRAM and may include the capacitor described above. In some cases, the electronic apparatus architecture may be implemented in a form in which computing unit elements and memory unit elements are adjacent to each other on a single chip, without distinction of sub-units.

As described herein, any devices, systems, modules, units, controllers, circuits, architectures, and/or portions thereof according to any of the example embodiments (including, without limitation, the field effect transistor 100, the field effect transistor 100*a*, the field effect transistor 100*b*, the field effect transistor 100*c*, the field effect transistor 200, the field effect transistor 200*a*, the capacitor 300, the capacitor 300*a*, the capacitor 300*b*, the electronic apparatus 1000, the electronic apparatus 1001, the electronic apparatus 1002, the electronic apparatus architecture (chip) 1100, the memory unit 1010, the arithmetic logic unit (ALU) 1020, the control unit 1030, the input/output devices 2000, the CPU 1500, the cache memory 1510, the ALU 1520, the control unit 1530, the main memory 1600, the auxiliary storage 1700, the input/output devices 2500, or the like) may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

Any of the memories, memory units, memory chips, storages, storage devices, or the like as described herein may be a non-transitory computer readable medium and may store a program of instructions. Any of the memories, memory units, memory chips, storages, storage devices, or the like described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

It should be understood that some example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A field effect transistor, comprising:
- a source region;
- a drain region;
- a channel between the source region and the drain region;
- a gate insulating layer configured to cover an upper surface of the channel; and
- a gate electrode configured to cover an upper surface of the gate insulating layer,
- wherein the gate insulating layer includes
  - a first region where a ferroelectric crystal structure is dominant, and
  - a second region where a non-ferroelectric structure is dominant,
- wherein the gate electrode includes
  - a first pattern region facing the first region of the gate insulating layer, and a second pattern region facing the second region of the gate insulating layer, and wherein the first pattern region includes a first thickness in a first direction transverse to the upper surface of the gate insulating layer and the second pattern region includes a second thickness in the first direction, the second thickness different from the first thickness.

2. The field effect transistor of claim 1, wherein the gate insulating layer includes a plurality of first regions that are spaced apart from each other and two-dimensionally arranged in a horizontal direction that is parallel to the upper surface of the channel or a lower surface of the gate electrode, the plurality of first regions including the first region, and the second region of the gate insulating layer is between the plurality of first regions on a same plane as the plurality of first regions.

3. The field effect transistor of claim 2, wherein the second region of the gate insulating layer is between at least two adjacent first regions of the plurality of first regions, such that the at least two adjacent first regions are separated from each other by at least the second region.

4. The field effect transistor of claim 3, wherein a cross-sectional area of each first region of the plurality of first regions in a horizontal plane that is parallel to the upper surface of the channel or the lower surface of the gate electrode is greater than or equal to about 0.25 $nm^2$ and less than or equal to about 1 $\mu m^2$.

5. The field effect transistor of claim 1, wherein the gate insulating layer includes a plurality of first regions having a stripe shape extending in a second direction, the plurality of first regions including the first region, and a plurality of second regions having a stripe shape extending in the second direction, the plurality of second regions including the second region, wherein the plurality of first regions and the plurality of second regions are alternately arranged in a third direction that is perpendicular to the second direction within a plane of the gate insulating layer.

6. The field effect transistor of claim 5, wherein a width of each region of the plurality of first regions and the plurality of second regions in the third direction is about 0.5 nm or more and about 1 μm or less.

7. The field effect transistor of claim 1, wherein the gate insulating layer comprises at least one of hafnium oxide doped with at least one element selected from zirconium (Zr), silicon (Si), aluminum (Al), lanthanum (La), gadolinium (Gd), and yttrium (Y), lead zirconate titanate (PZT), or zinc oxide.

8. The field effect transistor of claim 1, wherein, in the first region, a proportion of the ferroelectric crystal structure is about 65 at % or more and a proportion of the non-ferroelectric structure is about 35 at % or less, and in the second region, a proportion of the ferroelectric crystal structure is about 35 at % or less and a proportion of the non-ferroelectric structure is about 65 at % or more.

9. The field effect transistor of claim 1, wherein, in the first region, a proportion of orthorhombic crystals is about 65 at % or more and a proportion of a sum of monoclinic crystals, tetragonal crystals, and amorphous structure is about 35 at % or less, and in the second region, a proportion of orthorhombic crystals is about 35 at % or less and a proportion of a sum of monoclinic crystals, tetragonal crystals, and amorphous structure is about 65 at % or more.

10. The field effect transistor of claim 1, wherein the first pattern region of the gate electrode comprises a first conductive material, and the second pattern region of the gate electrode comprises a second conductive material having a thermal expansion coefficient that is different from a thermal expansion coefficient of the first conductive material.

11. The field effect transistor of claim 10, wherein the first pattern region of the gate electrode comprises a plurality of first conductive materials that are spaced apart from each other and two-dimensionally arranged in a direction parallel to the upper surface of the gate insulating layer within a plane of the gate electrode, the plurality of first conductive materials including the first conductive material, and the second conductive material is between the plurality of first conductive materials on a same plane as the plurality of first conductive materials.

12. The field effect transistor of claim 10, wherein the first pattern region of the gate electrode comprises a plurality of first conductive materials having a stripe shape extending in a second direction, the plurality of first conductive materials including the first conductive material, and the second pattern region of the gate electrode comprises a plurality of second conductive materials having a stripe shape extending in the second direction, the plurality of second conductive materials including the second conductive material, wherein the plurality of first conductive materials and the plurality of second conductive materials are alternately arranged in a third direction perpendicular to the first direction within a plane of the gate electrode.

13. The field effect transistor of claim 10, wherein the first conductive material and the first region are in direct contact with each other in the first direction, and the second conductive material and the second region are in direct contact with each other in the first direction.

14. The field effect transistor of claim 1, further comprising:

a non-ferroelectric layer between the channel and the gate insulating layer, wherein the non-ferroelectric layer comprises at least one of a paraelectric material, an antiferroelectric material, or an amorphous material.

15. The field effect transistor of claim 1, further comprising a non-ferroelectric layer between the gate insulating layer and the gate electrode, wherein the non-ferroelectric layer comprises at least one of a paraelectric material, an antiferroelectric material, or an amorphous material.

16. The field effect transistor of claim 1, further comprising:

a substrate, wherein the channel has a rod shape protruding and extending from an upper surface of the substrate, wherein the gate insulating layer covers and surrounds three sides of the channel, and wherein the gate electrode covers and surrounds three sides of the gate insulating layer.

17. The field effect transistor of claim 16, wherein the gate insulating layer includes a plurality of first regions extending along a surface of the channel in a stripe shape surrounding the three sides of the channel, the plurality of first regions including the first region, and a plurality of second regions extending along the surface of the channel in a stripe shape surrounding the three sides of the channel, the plurality of second regions including the second region, and the plurality of first regions and the plurality of second regions are alternately arranged.

18. A capacitor, comprising:

a first electrode;

a second electrode facing the first electrode; and a dielectric layer between the first electrode and the second electrode, wherein the dielectric layer includes a first region where a ferroelectric crystal structure is dominant, and a second region where a non-ferroelectric structure is dominant, wherein the second electrode includes a first pattern region facing the first region of the dielectric layer, and a second pattern region facing the second region of the dielectric layer and wherein the first pattern region includes a first thickness in a first direction transverse to an upper surface of the dielectric laver, and the second pattern region includes a second thickness in the first direction, the second thickness different from the first thickness.

19. The capacitor of claim 18, further comprising a non-ferroelectric layer that is between the first electrode and the dielectric layer, or between the second electrode and the dielectric layer.

20. An electronic apparatus, comprising:

a field effect transistor; and a capacitor electrically connected to the field effect transistor, wherein the field effect transistor includes a source region, a drain region, a channel between the source region and the drain region, a gate insulating layer configured to cover an upper surface of the channel, and a gate electrode configured to cover an upper surface of the gate insulating layer, wherein the gate insulating layer includes a first region where a ferroelectric crystal structure is dominant, and a second region where a non-ferroelectric structure is dominant, wherein the gate electrode includes a first pattern region facing the first region of the gate insulating layer, and a second pattern region facing the second region of the gate insulating layer, and wherein the first pattern region includes a first thickness in a first direction transverse to the upper surface of the gate insulating layer, and the second pattern region includes a second thickness in the first direction, the second thickness different from the first thickness.

* * * * *